United States Patent
Dimberg et al.

(10) Patent No.: US 12,261,008 B2
(45) Date of Patent: Mar. 25, 2025

(54) RETROFIT REMOTE CONTROL DEVICES

(71) Applicant: Lutron Technology Company LLC, Coopersburg, PA (US)

(72) Inventors: Chris Dimberg, Easton, PA (US); Jason C. Killo, Emmaus, PA (US); Brad Michael Kreschollek, Bethlehem, PA (US); Matthew Philip McDonald, Phoenixville, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 17/868,380

(22) Filed: Jul. 19, 2022

(65) Prior Publication Data
US 2022/0367128 A1    Nov. 17, 2022

Related U.S. Application Data

(63) Continuation of application No. 16/921,560, filed on Jul. 6, 2020, now Pat. No. 11,410,821, which is a
(Continued)

(51) Int. Cl.
*H01H 9/02* (2006.01)
*H01H 9/28* (2006.01)
(Continued)

(52) U.S. Cl.
CPC ............ *H01H 9/0207* (2013.01); *H01H 9/02* (2013.01); *H01H 9/0235* (2013.01);
(Continued)

(58) Field of Classification Search
CPC ...... H01H 9/0207; H01H 9/02; H01H 9/0235; H01H 9/287; H01H 11/00; H01H 23/16;
(Continued)

(56) References Cited

U.S. PATENT DOCUMENTS

| | | | |
|---|---|---|---|
| 4,835,343 A * | 5/1989 | Graef | H02G 3/14 |
| | | | 220/241 |
| 4,998,635 A | 3/1991 | Vink et al. | |

(Continued)

FOREIGN PATENT DOCUMENTS

| | | |
|---|---|---|
| CN | 2596671 Y | 12/2003 |
| CN | 101347050 A | 1/2009 |

(Continued)

OTHER PUBLICATIONS

Lutron, "Installation Instructions for Large Button Master Control Button Kits", The Radio RA, Large Button Master Control Button Kits, RALK-2W-SD, RALK-5W-RL, RALK-5W-AO, RALK-PGM, Jan. 1, 2004 00:00:00.0, 2 pages.

*Primary Examiner* — Hal Kaplan
*Assistant Examiner* — Swarna N Chowdhuri
(74) *Attorney, Agent, or Firm* — Flaster Greenberg, PC

(57) ABSTRACT

Remote control devices may control electrical loads and/or load control devices of a load control system without accessing electrical wiring. The remote control device may be mounted over a mechanical switch that is installed in a multi-gang wallbox adjacent to a second electrical device, such as another mechanical switch or an electrical receptacle. The second electrical device may be recessed with respect to the remote control device and may be brought forward towards a front surface of the adapter by loosening a first set of screws that attach a yoke of the second electrical device to the multi-gang wallbox, and tightening a second set of screws that attach the adapter to the yoke of the second electrical device. The remote control device may comprise one or more configurable attachment members for attaching the adapter to the yoke of the mechanical switch and/or to the yoke of the second electrical device.

33 Claims, 29 Drawing Sheets

Related U.S. Application Data continuation of application No. 15/469,079, filed on Mar. 24, 2017, now Pat. No. 10,741,339.

(60) Provisional application No. 62/312,863, filed on Mar. 24, 2016.

(51) Int. Cl.

| | | |
|---|---|---|
| *H01H 11/00* | (2006.01) | |
| *H01H 23/16* | (2006.01) | |
| *H02G 3/14* | (2006.01) | |
| *H03K 17/96* | (2006.01) | |
| *H05B 45/00* | (2022.01) | |
| *H05B 47/10* | (2020.01) | |
| *H05B 47/19* | (2020.01) | |

(52) U.S. Cl.
CPC ............ *H01H 9/287* (2013.01); *H01H 11/00* (2013.01); *H01H 23/16* (2013.01); *H02G 3/14* (2013.01); *H03K 17/962* (2013.01); *H05B 45/00* (2020.01); *H05B 47/10* (2020.01); *H05B 47/19* (2020.01); *H01H 9/025* (2013.01); *H01H 2223/034* (2013.01); *H01H 2300/03* (2013.01); *Y02B 90/20* (2013.01); *Y04S 20/14* (2013.01)

(58) Field of Classification Search
CPC ............ H01H 9/025; H01H 2223/034; H01H 2300/03; H05B 45/00; H05B 47/19; H05B 47/10; H02G 3/14; H03K 17/962; Y02B 90/20; Y04S 20/14
USPC ........................................................ 307/140
See application file for complete search history.

(56) References Cited

U.S. PATENT DOCUMENTS

| | | | |
|---|---|---|---|
| 5,180,886 A | | 1/1993 | Dierenbach et al. |
| 5,264,761 A | | 11/1993 | Johnson et al. |
| 5,458,311 A | | 10/1995 | Holbrook |
| 7,834,856 B2 | | 11/2010 | Grinshpoon et al. |
| 7,910,849 B2 | | 3/2011 | Hibshman et al. |
| 8,167,457 B1 | | 5/2012 | Forster et al. |
| 8,389,857 B2 | | 3/2013 | Petrillo et al. |
| 9,208,965 B2 | | 12/2015 | Busby et al. |
| D761,277 S | | 7/2016 | Harvell |
| 9,418,802 B2 | | 8/2016 | Romano et al. |
| 9,520,247 B1 | | 12/2016 | Finnegan et al. |
| 9,583,288 B2 | | 2/2017 | Jones et al. |
| 9,746,138 B1 | | 8/2017 | Thomas et al. |
| 9,799,469 B2 | | 10/2017 | Bailey et al. |
| 9,959,997 B2 | | 5/2018 | Bailey et al. |
| 2003/0019733 A1 | | 1/2003 | Sato |
| 2003/0019734 A1 | | 1/2003 | Sato et al. |
| 2003/0230982 A1 | | 12/2003 | Pagano et al. |
| 2006/0278504 A1 | | 12/2006 | Brojanac et al. |
| 2007/0289860 A1 | | 12/2007 | Newman et al. |
| 2008/0258644 A1 | | 10/2008 | Altonen et al. |
| 2008/0315798 A1 | | 12/2008 | Diederiks et al. |
| 2009/0256483 A1 | | 10/2009 | Gehman et al. |
| 2010/0084996 A1 | | 4/2010 | Van De Sluis et al. |
| 2010/0127626 A1 | | 5/2010 | Altonen et al. |
| 2010/0244706 A1 | | 9/2010 | Steiner et al. |
| 2010/0244709 A1 | | 9/2010 | Steiner et al. |
| 2012/0091213 A1* | | 4/2012 | Altonen ............... H05B 47/115 236/51 |
| 2012/0091804 A1* | | 4/2012 | Altonen ................ H05B 47/19 307/31 |
| 2012/0292174 A1 | | 11/2012 | Mah et al. |
| 2013/0099011 A1 | | 4/2013 | Matsuoka et al. |
| 2013/0099124 A1 | | 4/2013 | Filson et al. |
| 2013/0338839 A1 | | 12/2013 | Rogers et al. |
| 2014/0117859 A1 | | 5/2014 | Swatsky et al. |
| 2014/0117871 A1 | | 5/2014 | Swatsky et al. |
| 2014/0139047 A1* | | 5/2014 | Haines ................. H05K 5/0026 307/140 |
| 2014/0145646 A1 | | 5/2014 | Zhang et al. |
| 2014/0152186 A1 | | 6/2014 | Zhang |
| 2014/0266669 A1 | | 9/2014 | Fadell et al. |
| 2015/0077021 A1 | | 3/2015 | McCarthy et al. |
| 2015/0294816 A1 | | 10/2015 | Evers et al. |
| 2015/0371534 A1 | | 12/2015 | Dimberg et al. |
| 2016/0007431 A1 | | 1/2016 | Bosua et al. |
| 2016/0013626 A1 | | 1/2016 | Gage |
| 2016/0073479 A1 | | 3/2016 | Erchak et al. |
| 2017/0105176 A1 | | 4/2017 | Finnegan et al. |
| 2017/0226799 A1 | | 8/2017 | Hebeisen et al. |
| 2017/0288350 A1 | | 10/2017 | Andersen et al. |
| 2018/0190451 A1 | | 7/2018 | Scruggs |

FOREIGN PATENT DOCUMENTS

| | | |
|---|---|---|
| CN | 102293060 A | 12/2011 |
| CN | 203491998 U | 3/2014 |
| WO | 2014066269 A1 | 5/2014 |
| WO | 2015038473 A1 | 3/2015 |

* cited by examiner

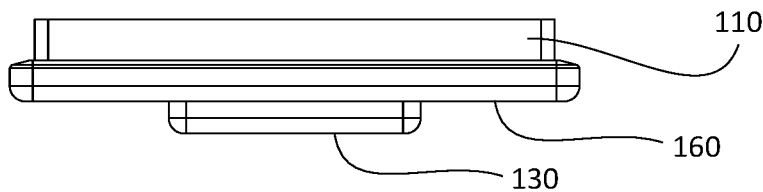
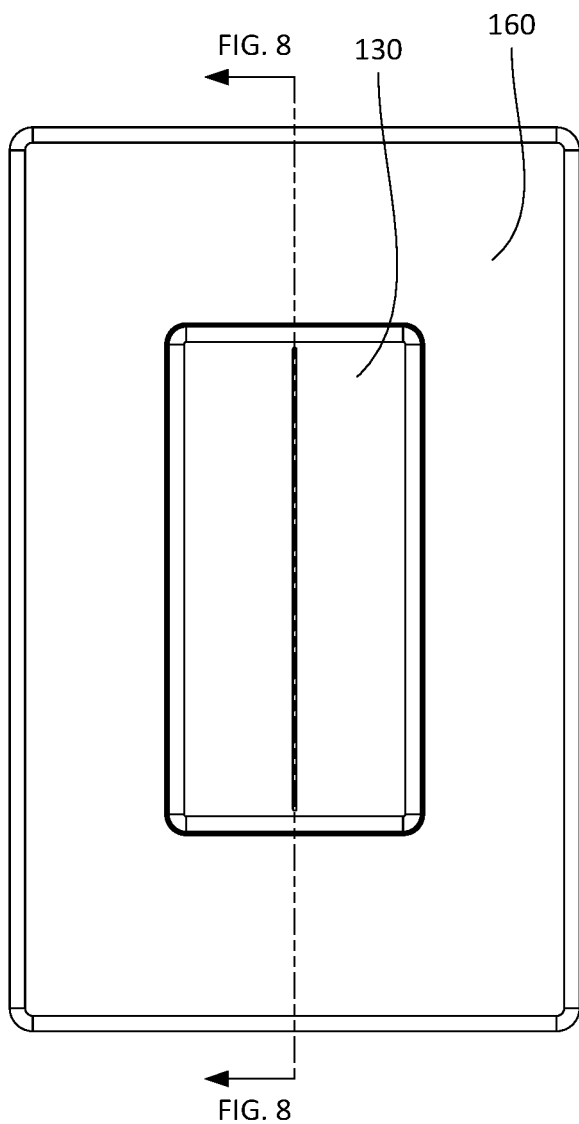
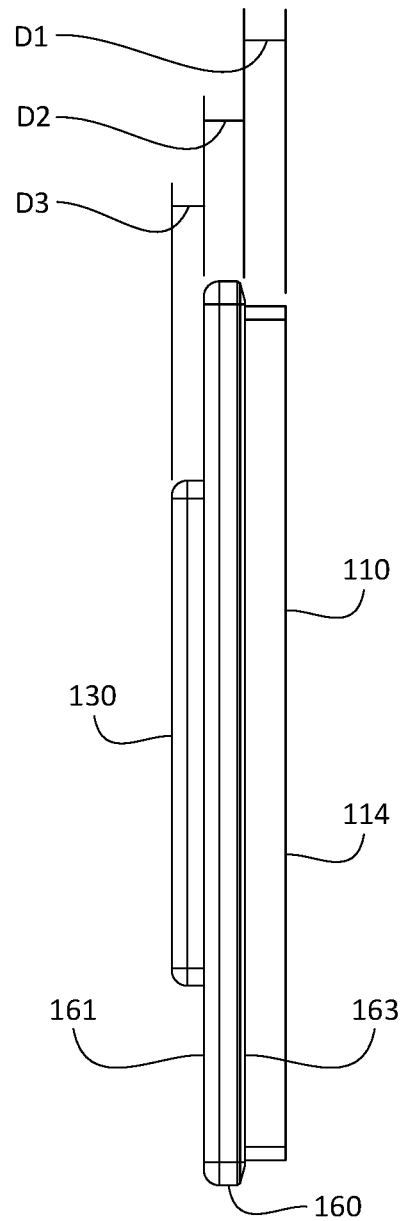
FIG. 7C
FIG. 7A
FIG. 7B

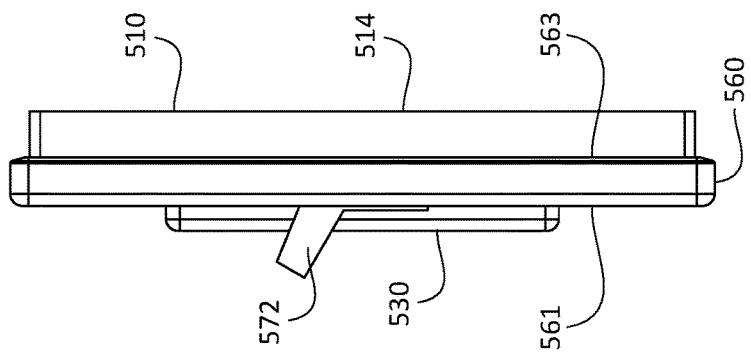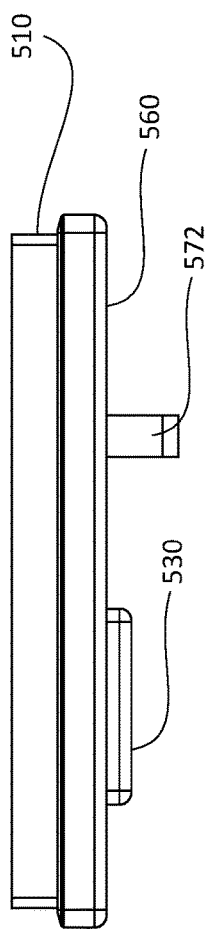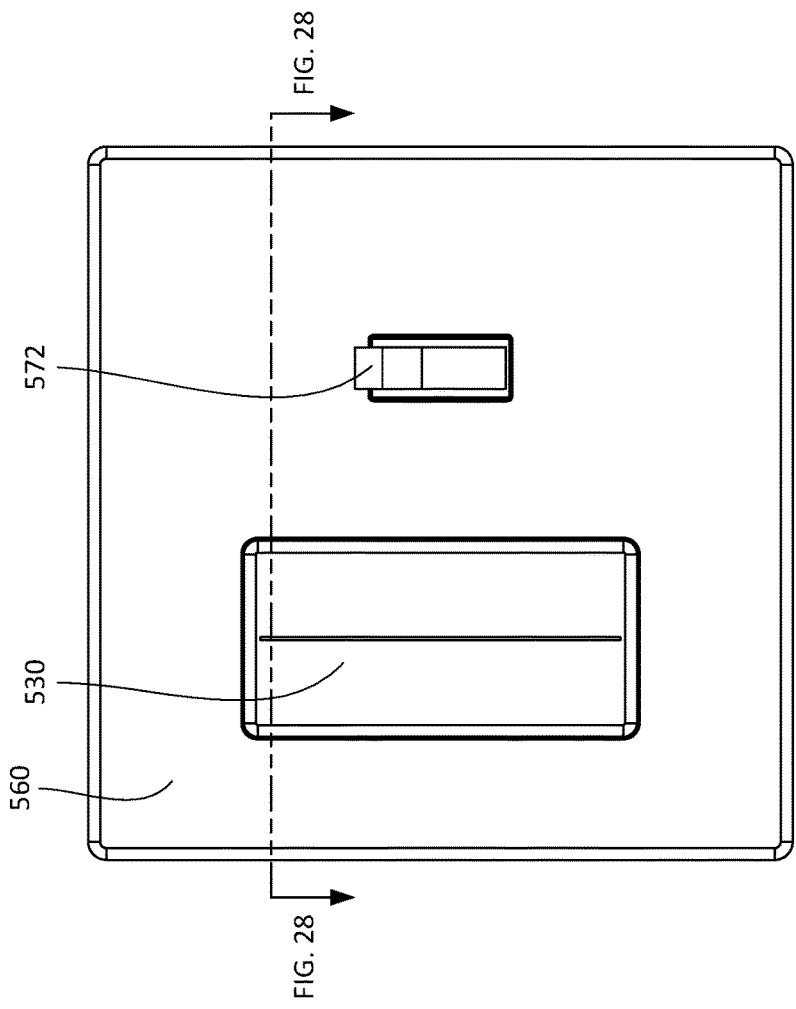

RETROFIT REMOTE CONTROL DEVICES

CROSS REFERENCE TO RELATED APPLICATIONS

This application is a continuation of U.S. Non-Provisional application Ser. No. 16/921,560, filed Jul. 6, 2020, which is a continuation of U.S. Non-Provisional application Ser. No. 15/469,079, filed Mar. 24, 2017, and claims the benefit of provisional U.S. patent application No. 62/312,863, filed Mar. 24, 2016, the disclosure of which is incorporated herein by reference in its entirety.

BACKGROUND

During the installation of typical load control systems, standard mechanical switches, such as traditional toggle switches or decorator paddle switches, may be replaced by more advanced load control devices, such as dimmer switches, that control the amount of power delivered from an alternating current (AC) power source to one or more electrical loads. Such an installation procedure typically requires that the existing mechanical switch be disconnected from the electrical wiring and removed from a wallbox in which it is mounted, and that the load control device then be connected to the electrical wiring and installed in the wallbox. An average consumer may not feel comfortable performing the electrical wiring required in such an installation. Accordingly, such a procedure may typically be performed by an electrical contractor or other skilled installer. However, hiring an electrical contractor may be cost prohibitive to the average consumer.

Additionally, a lighting control system for which additional remote control is desired may include one or more "smart" devices, such as smart bulbs, that are already installed in the lighting control system. Such smart devices may be installed in receptacles that are controlled by a wall-mounted switch. However, when the wall-mounted switch is operated to an off position, power to the existing smart devices may be cut, such that they no longer respond to commands from remote control devices. Accordingly, it is desirable to prevent operation of such a wall-mounted switch to ensure that the delivery of power to existing smart devices in the lighting control system continues uninterrupted.

SUMMARY

As described herein, example remote control devices may provide simple retrofit solutions for existing switched control systems. Implementation of the remote control devices, for example in existing switched control systems, may enable energy savings and/or advanced control features, for example without requiring any electrical re-wiring and/or without requiring the replacement of any existing mechanical switches.

The remote control devices may be configured to control one or more electrical loads, such as lighting loads, and/or load control devices. The remote control devices may be configured to be mounted over the respective actuators of existing mechanical switches that, for example, may control whether power is delivered to the one or more electrical loads. The remote control devices may be configured to control one or more load control devices of a load control system without requiring access to the electrical wiring of the load control system. One or more electrical loads may be electrically connected to a load control device such that the load control device may control an amount of power delivered to the one or more electrical loads. The control unit of each remote control device may be configured to transmit one or more commands for controlling the electrical loads via wireless communication.

The remote control devices may be configured to maintain the actuators of mechanical switches over which they are installed in respective on positions, such that users of the remote control devices are not able to mistakenly switch the actuators to the off position, which may cause one or more electrical load to be unpowered such that the one or more electrical loads cannot be controlled by one or more remote control devices. The remote control device may be configured to control multiple types of electrical loads on a single electrical circuit, for instance substantially in unison. A load control system may include multiple remote control devices that are configured to provide individual, such as zoned control of each of a plurality of electrical loads coupled to a single electrical circuit.

Each remote control device may include an adapter that is configured to be attached to the respective yokes of one or more installed mechanical switches, a control unit that is configured to be removably attached to the adapter, and a faceplate that is also configured to be removably attached to the adapter. One or more of the adapter, the control unit, and the faceplate of each remote control device may be configured so as to be staggered relative to a surface of a structure to which the one or more mechanical switches are installed, such as a wallboard surface that surrounds a wallbox in which the one or more mechanical switches are installed.

In an example installation process, the remote control device may be installed by: (1) removing a switch plate from a mechanical switch that is installed in a single-gang wallbox; (2) attaching an adapter of the remote control device to a yoke of the mechanical switch; (3) attaching a control unit of the remote control device to the adapter; and (4) attaching a faceplate of the remote control device to the adapter, wherein the faceplate defines an opening through which a portion of the control unit is received as the faceplate is attached to the adapter.

The remote control device may be mounted over a mechanical switch that is installed in a multi-gang wallbox adjacent to a second electrical device, such as another mechanical switch or an electrical receptacle. The remote control device may include an adapter that may define first and second openings and may be attached to a yoke of the mechanical switch over which the remote control is mounted. The first opening may be configured to surround a bezel of the mechanical switch and the second opening may be configured to surround a portion of the second electrical device. When the remote control device is mounted over the mechanical switch, the second electrical device may be recessed with respect to the remote control device. The second electrical device may be brought forward towards a front surface of the adapter by loosening a first set of screws that attach a yoke of the second electrical device to the multi-gang wallbox, and tightening a second set of screws that attach the adapter to the yoke of the second electrical device, such that the yoke of the second electrical device is drawn outward from the multi-gang wallbox.

The remote control device may comprise one or more attachment members for attaching the adapter to the yoke of the mechanical switch and/or the yoke of the second electrical device. The attachment members may be configured to be attached to the adapter in multiple orientations to allow different types of devices (e.g., different types of toggle switches, such as traditional toggle switches or decorator paddle switches, and/or different types of electrical receptacles) to be connected to the adapter and mounted next to the mechanical switch over which the remote control is mounted. In addition, the remote control device may be configured to be mounted to the attachment members.

BRIEF DESCRIPTION OF THE DRAWINGS

FIG. 7A is a front view of the example remote control device illustrated in FIG. 1.

FIG. 7B is a side view of the example remote control device illustrated in FIG. 1.

FIG. 7C is a top view of the example remote control device illustrated in FIG. 1.

FIG. 27A is a front view of the example remote control device illustrated in FIG. 21.

FIG. 27B is a side view of the example remote control device illustrated in FIG. 21.

FIG. 27C is a top view of the example remote control device illustrated in FIG. 21.

DETAILED DESCRIPTION

Figure 1:
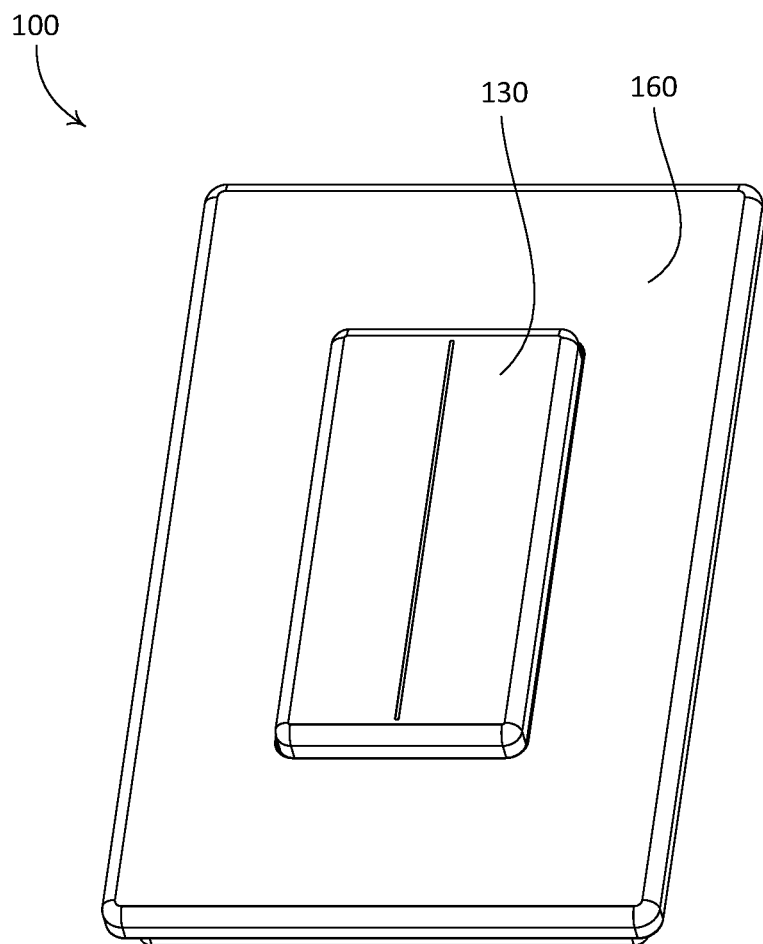
FIG. 1 is a perspective view of an example remote control device.
Figure 2:
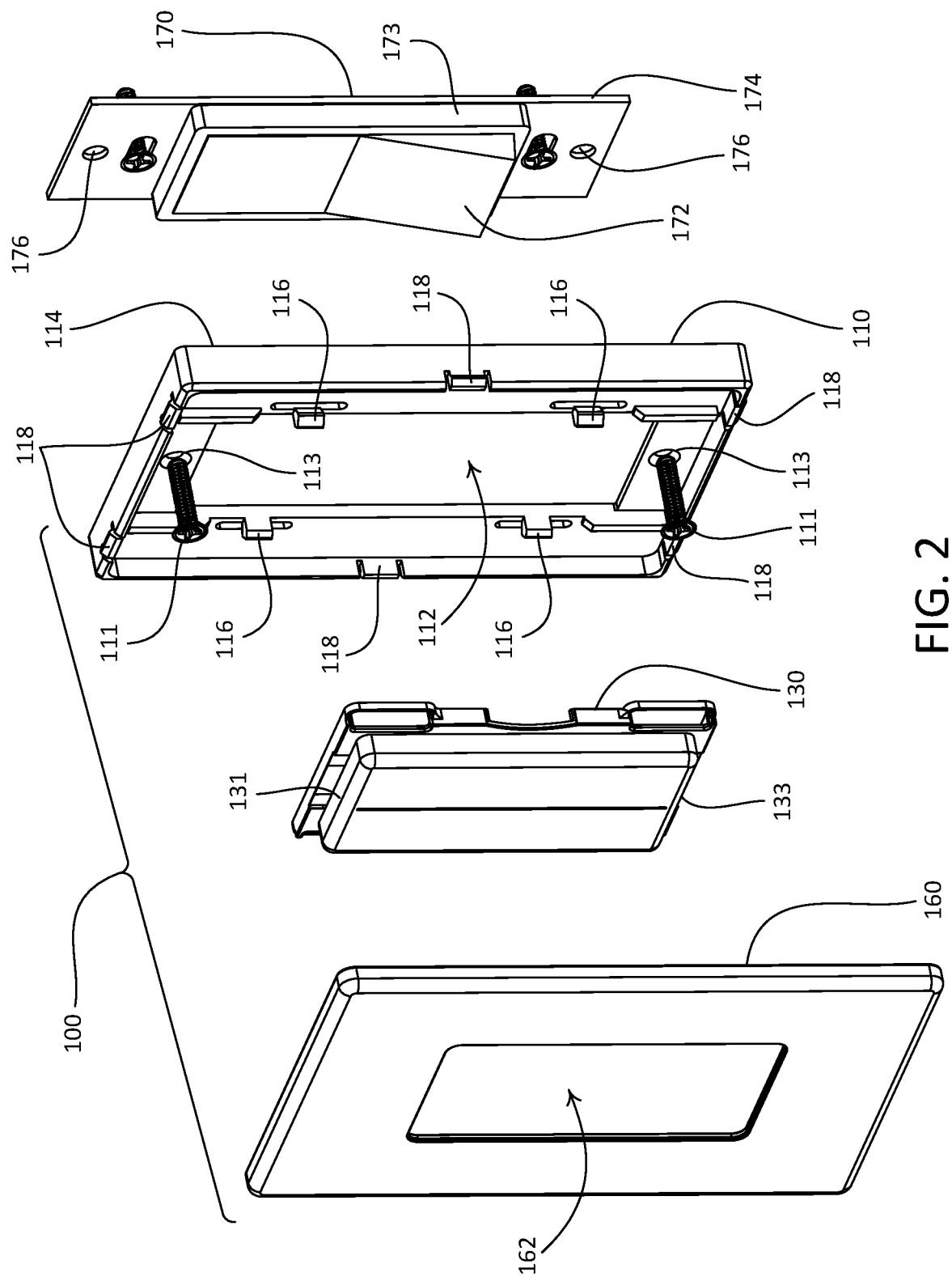
FIG. 2 is an exploded view of the example remote control device illustrated in FIG. 1.

FIGS. 1 and 2 depict an example remote control device 100 that may be installed in a load control system, such as a lighting control system. The load control system may include a mechanical switch 170 that may be in place prior to installation of the remote control device 100, for example pre-existing in the load control system. As shown, the mechanical switch 170 may be a standard decorator paddle switch. The load control system may further include one or more electrical loads, such as lighting loads. The mechanical switch 170 may be coupled in series electrical connection between an alternating current (AC) power source and the one or more electrical loads. The mechanical switch 170 may include an actuator 172 that may be actuated to turn on and/or turn off, the one or more electrical loads. The mechanical switch 170 may include a yoke 174 that enables mounting of the mechanical switch 170 to a structure. For example, the yoke 174 may be fastened to a single-gang wallbox that is installed in an opening of a wall.

The load control system may further include a load control device that is electrically connected to the one or more electrical loads. The load control device may include a load control circuit for controlling the intensity of one or more of the electrical loads between a low end intensity (e.g., approximately 1%) and a high-end intensity (e.g., approximately 100%), and may include a wireless communication circuit. In an example implementation, the load control device may be a standalone dimmer switch that is electrically connected to the one or more electrical loads. In another example implementation, each of the one more electrical loads may include a respective integrated load control circuit and wireless communication circuit, such that each electrical load includes a corresponding load control device that is configured for wireless communication. It should be appreciated that the load control system is not limited to the example load control devices described herein.

As shown, the example remote control device 100 may include an adapter 110, a control unit 130, and a faceplate 160. Prior to installation of the remote control device 100, a pre-existing faceplate (not shown) may be removed from the mechanical switch 170, for instance by removing faceplate screws (not shown) from corresponding faceplate screw holes 176 in the yoke 174. The adapter 110 may be made of any suitable material, such as plastic. The adapter 110 may be configured to be attached to the yoke 174 of the mechanical switch 170. For example, the adapter 110 may be secured to the yoke 174 using fasteners, such as screws 111 that are received through openings 113 in the adapter 110 and installed into the faceplate screw holes 176 in the yoke 174. As shown, the adapter 110 may define an opening 112 that extends therethrough. The opening 112 may be configured to receive a portion of the mechanical switch 170 that may include, for example, the actuator 172 and a bezel 173 that surrounds a perimeter of the actuator 172. The adapter 110 may define a rear surface 114 that is configured to abut a surface of a structure to which the mechanical switch 170 is installed, such as a wallboard surface that surrounds a wallbox in which the mechanical switch 170 is installed.

The adapter 110 may be configured to enable removable attachment of the control unit 130 to the adapter 110. For example, the adapter 110 may define one or more attachment members that are configured to engage with complementary features of the control unit 130. As shown, the adapter 110 may define one or more resilient snap fit connectors 116 that are configured to engage with complementary features of the control unit 130. The adapter 110 may be configured to enable removable attachment of the faceplate 160 to the adapter 110. For example, the adapter 110 may define one or more attachment members that are configured to engage with complementary features of the faceplate 160. As shown, the adapter 110 may define one or more resilient snap fit connectors 118 that are configured to engage with complementary features of the faceplate 160.

The faceplate may define a front surface 161 and an opposed rear surface 163. The front surface 161 may alternatively be referred to as an outer surface of the faceplate 160, and the rear surface 163 may alternatively be referred to as an inner surface of the faceplate 160. The faceplate 160 may define an opening 162 therethrough that is configured to receive a portion of the control unit 130, such that the control unit 130 protrudes proud of the faceplate 160 when the remote control device 100 is in an assembled configuration. As shown, the faceplate 160 may define recessed ledges 164 that are configured to engage with corresponding ones of the snap fit connectors 118 of the adapter 110, to releasably attach the faceplate 160 to the adapter 110. The faceplate 160 may be made of any suitable material, such as plastic.

Figure 3A:
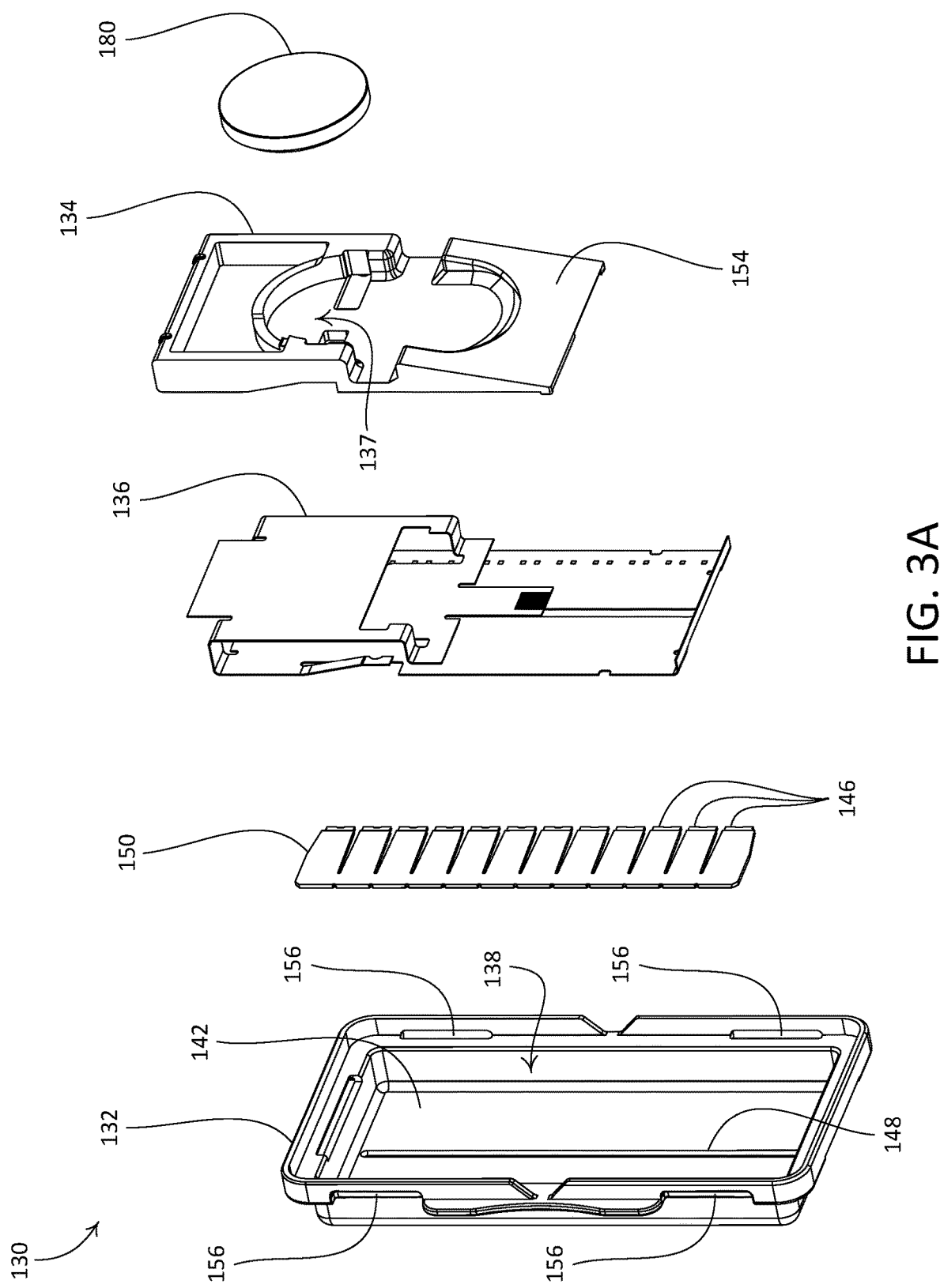
FIG. 3A is an exploded rear perspective view of a control unit component of the example remote control device illustrated in FIG. 2.
Figure 3B:
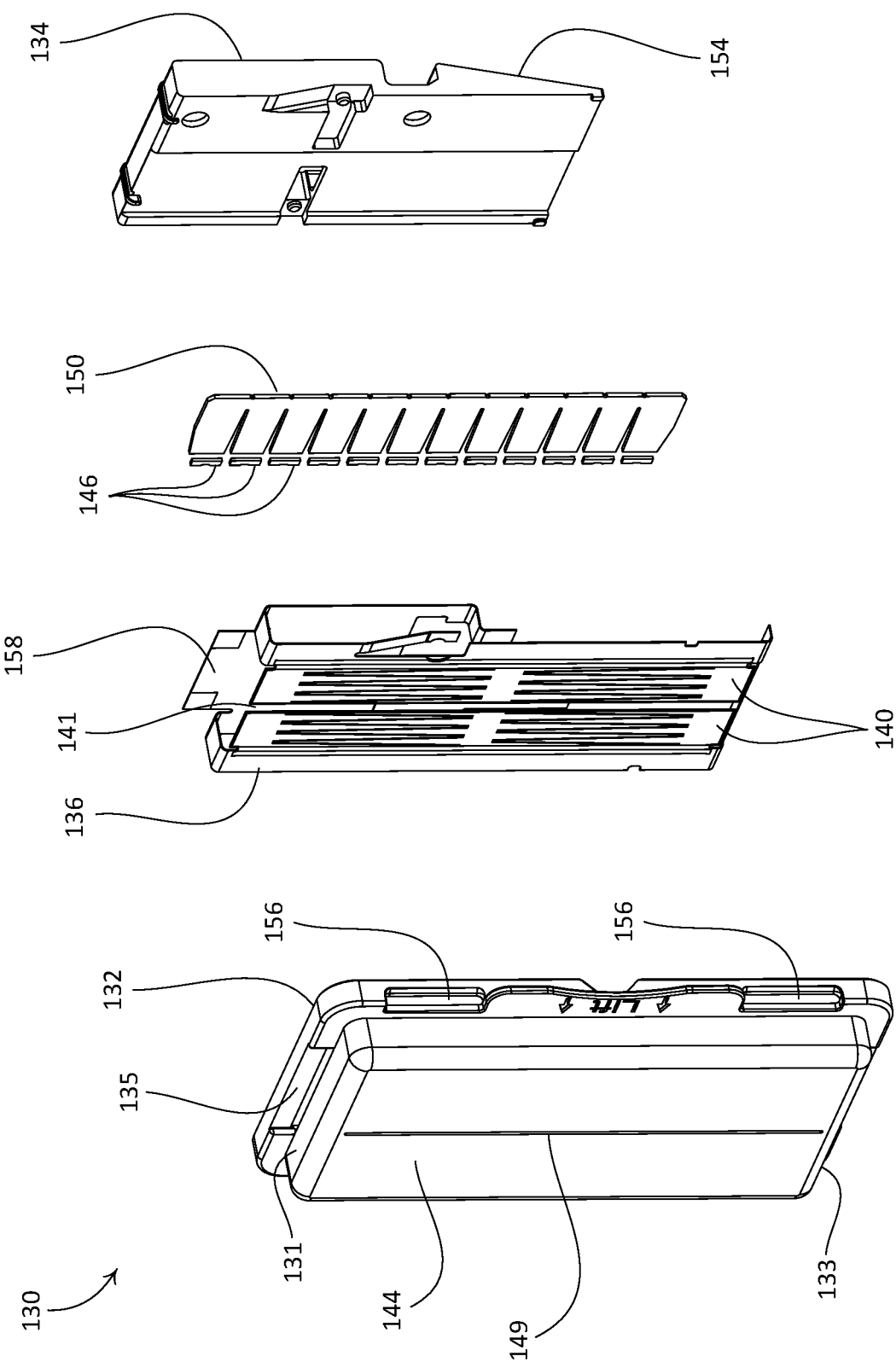
FIG. 3B is an exploded front perspective view of the control unit control unit component of the example remote control device illustrated in FIG. 2.

As shown in FIGS. 3A and 3B, the control unit 130 may include a cover 132, an insert 134 that is configured to be received in the cover 132, and a flexible circuit board 136 that may be configured to be wrapped around a portion of the insert 134. The cover 132 and the insert 134 may be made of any suitable material, such as plastic. The illustrated control unit 130 is rectangular in shape and is elongate between a first end 131 and an opposed second end 133. It should be appreciated that the control unit 130 is not limited to the illustrated rectangular geometry, and that control unit may alternatively be configured with other suitable geometries. In accordance with the illustrated orientation of the control unit 130, the first end 131 may be referred to as an upper end of the control unit 130 and the second end 133 may be referred to as a lower end of the control unit 130. The first and second ends 131, 133 of the control unit 130 may also be referred to as first and second ends of the cover 132, respectively. The cover 132 may define a void 138 that is configured to receive the insert 134 with the flexible circuit board 136 wrapped around the insert 134 in an attached position. The cover 132 may define an inner surface 142 and an opposed outer surface 144. The outer surface 144 of the cover 132 may alternatively be referred to as a front surface of the cover 132, and more generally as an outer surface of the control unit 130.

The control unit 130 may define a capacitive touch user interface that is configured to receive inputs, such as gestures, from a user of the remote control device 100. For example, the flexible circuit board 136 may include one or more capacitive touch regions, or surfaces. As shown, the flexible circuit board 136 includes a linear capacitive touch surface 140 that faces the inner surface 142 of the cover 132 when the flexible circuit board 136 is wrapped around the insert 134 and disposed in the void 138. The capacitive touch surface 140 may be configured to detect touches along an x axis, a y axis, or both an x and y axis.

The control unit 130 may further include a control circuit (not shown) and a wireless communication circuit (not shown). The control circuit and the wireless communication circuit may be mounted to the flexible circuit board 136, for example. The control circuit may be in electrical communication with the capacitive touch surface 140, and the wireless communication circuit may be in electrical communication with the control circuit. The flexible circuit board 136 may be configured to wrap around the insert 134 such that the capacitive touch surface 140 is spaced from the control circuit, the wireless communication circuit, and/or other "noisy" circuitry of the flexible circuit board 136 along a direction that extends perpendicular to the outer surface 144 of the cover 132. This may improve operational efficiency of the capacitive touch surface 140.

The control unit 130 may be configured to translate one or more inputs applied via the capacitive touch surface 140 into respective control signals that may be used to control a load control device of a load control system. For example, the control circuit may be configured to receive signals from the capacitive touch surface 140 that correspond to inputs, such as gestures, applied to the capacitive touch surface 140 by a user of the remote control device 100. The control circuit may be configured to interpret the signals into commands that the user desires the control unit 130 to cause to be executed.

The control circuit may be configured to recognize a plurality of signals received from the capacitive touch surface 140 that correspond to user inputs or gestures applied via the capacitive touch surface 140. The control unit 130 may be configured to provide a visual indication associated with inputs and/or gestures received by the capacitive touch surface 140. For example, as shown, the control unit 130 may further include a plurality of light emitting diodes (LEDs) 146 that are configured to provide the visual indication. In accordance with the illustrated control unit 130, the plurality of LEDs 146 are arranged in a linear array that extends between the first and second ends 131, 133 of the control unit 130, and may be attached to the flexible circuit board 136 approximate to an outer edge thereof. The cover 132 may define an opening that allows light from one or more of the LEDs 146 to be emitted outward from an interior of the cover 132. For example, as shown, the cover 132 defines a narrow slot 148 that extends between the first and second ends 131, 133 of the cover 132. The cover 132 may include a light bar 149 that is disposed in the slot 148. The capacitive touch surface 140 may define a gap 141, for example approximately midway between opposed sides of the flexible circuit board 136 or near a side thereof. The control unit may further include a light guide 150 that may be configured to diffuse light emitted from the LEDs 146 through the gap 141 at respective locations along the slot 148. The light guide 150 may comprise light guide film, for example. It should be appreciated that the control unit 130 is not limited to the illustrated array of LEDs 146 and/or the illustrated geometry of the slot 148.

The control circuit may be configured to recognize a plurality of signals received from the capacitive touch surface 140 that correspond to user inputs or gestures applied via the capacitive touch surface 140. For example, the control circuit may receive a signal indicative of a "touch" or "tap" gesture applied at a specific location on the capacitive touch surface 140. The control circuit may be configured to interpret a signal corresponding to such a gesture as a command for an associated load control device to "go to" a desired dimming level (e.g., a desired intensity level), such as a command for a lighting load of a load control system to go to a desired dimming level, where the desired dimming level is dependent upon a location on the capacitive touch surface 140, such as a position along the light bar 149, at which the poke gesture is applied.

In another example, the control circuit may receive a signal indicative of a "swipe" gesture applied along a specific region of the capacitive touch surface 140. The control circuit may be configured to interpret a signal corresponding to a swipe in an upward direction as a command for a lighting load to go to a full intensity dimming level (e.g., a high-end intensity), and may be configured to interpret a signal corresponding to a swipe in a downward direction as a command for the lighting load to go to a minimal dimming level (e.g., a low-end intensity, such as 1% or off).

In still another example, the control circuit may receive a signal indicative of a "smack" gesture applied to the capacitive touch surface 140. A "smack" gesture may, may for example, comprise touching or tapping the capacitive touch surface 140 (e.g., using multiple fingers simultaneously) such that contact is made to a larger area of the capacitive touch surface 140 than would be contacted during a "touch" or "tap" by a single finger. The control circuit may be configured to interpret a signal corresponding to such a gesture as a command to toggle a state of the lighting load, for example from on to off or from off to on.

In still another example, the control circuit may receive a signal indicative of a "relative" gesture applied to the capacitive touch surface 140, such as a touch by two fingers that are spaced apart, a two-finger "pinch" gesture (e.g., fingers moving together), a two-finger "open" gesture (e.g., fingers moving apart), or the like. The control circuit may be configured to interpret a signal corresponding to such a gesture as a command to incrementally increase or decrease a current dimming level of one or more lighting loads, for example by corresponding predetermined amounts. For example, such a gesture may cause multiple lighting loads that are configured to be controlled by the remote control device 100 to raise or lower their respective intensities, such that an aggregate amount of light (e.g., within a space) may be changed, while allowing the multiple lighting loads to maintain respective power levels that are different from one another.

In an illustrative example of using a relative gesture, the remote control device 100 may be associated with first and second dimmable lighting loads in a load control system. The first lighting load may be off, and the second lighting load may be powered at approximately 50% intensity. In a first scenario, if the control circuit receives a "touch" or "tap" gesture applied at a specific location on the capacitive touch surface 140 that corresponds to 25% intensity, the control circuit may cause the wireless communication circuit to transmit one or more commands that cause the second lighting load to dim directly to 25% intensity, and that cause the first lighting load to turn on directly to 25% intensity. In an alternative second scenario, if the control circuit instead receives a "relative" gesture applied via the capacitive touch surface 140, the gesture indicative of a gradual dimming adjustment, the control circuit may issue one or more commands that cause the second lighting load to slowly dim down to an intensity that matches the lighting level desired by the user, while leaving the first lighting load in an off state.

The control circuit may be configured to associate particular user gestures with predetermined scenes, such as predefined lighting scenes for example. The control circuit may be configured to enable one or more of user-programmable, reprogrammable, and custom gestures. Gestures may be applied to the capacitive touch surface 140, for example, via direct contact with the outer surface 144 of the cover 132, via proximity of anatomy to the outer surface 144 of the cover 132, or otherwise. The control circuit may be configured to associate particular user gestures with predetermined scenes, such as predefined lighting scenes for example. The control circuit may be configured to enable one or more of user-programmable, reprogrammable, and custom gestures. Gestures may be applied to the capacitive touch surface 140, for example, via direct contact with the outer surface 144 of the cover 132, via proximity of anatomy to the outer surface 144 of the cover 132, or otherwise.

It should be appreciated that the control circuit is not limited to interpreting signals associated with the above-described example gestures, and that the control circuit may be alternatively configured to interpret signals associated with more, fewer, or different gestures as desired. As shown, the capacitive touch surface 140 defines one linear column (e.g., a one-dimensional column) that may provide a Y-axis output. However, it should further be appreciated that the control unit 130 is not limited to the illustrated capacitive touch surface 140. For example, the capacitive touch surface 140 may alternatively define, for example, two, three, or more linear columns that may provide respective Y-axis outputs, one or more linear rows that provide respective X-axis outputs, or any combination thereof. The capacitive touch surface 140 may also be, for example, a two-dimensional touch element having both X-axis and Y-axis outputs. Such alternative implementations may enable the remote control device to control multiple electrical loads from the control unit 130. For example, gestures applied to a first capacitive touch column may cause commands to be issued to a first lighting load associated with the first capacitive touch column, gestures applied to a second capacitive touch column may cause commands to be issued to a second lighting load associated with the second capacitive touch column, and gestures applied simultaneously to both the first and second capacitive touch columns may cause a command to be issued to both the first and second lighting loads.

The cover 132, the capacitive touch surface 140, the plurality of LEDs 146, and the slot 148 may cooperate with one another to define a capacitive touch interface of the control unit 130, and more generally of the remote control device 100. The capacitive touch interface may be configured to provide a visual indication of a command issued by the remote control device 100. For example, the capacitive touch interface may be configured to, upon receiving a gesture indicative of a command to change an amount of power delivered to an electrical load, such as a command to dim a lighting load of a lighting control system, indicate the amount of power delivered to the electrical load by temporarily illuminating a number of the plurality of LEDs 146 that corresponds with the desired amount of power (e.g., the desired dimming level of the lighting load). In such an example, the control circuit may be configured to cause the LEDs 146 to be illuminated simultaneously, to illuminate sequentially with some or little overlap before fading, or to otherwise illuminate as desired.

Figure 4:
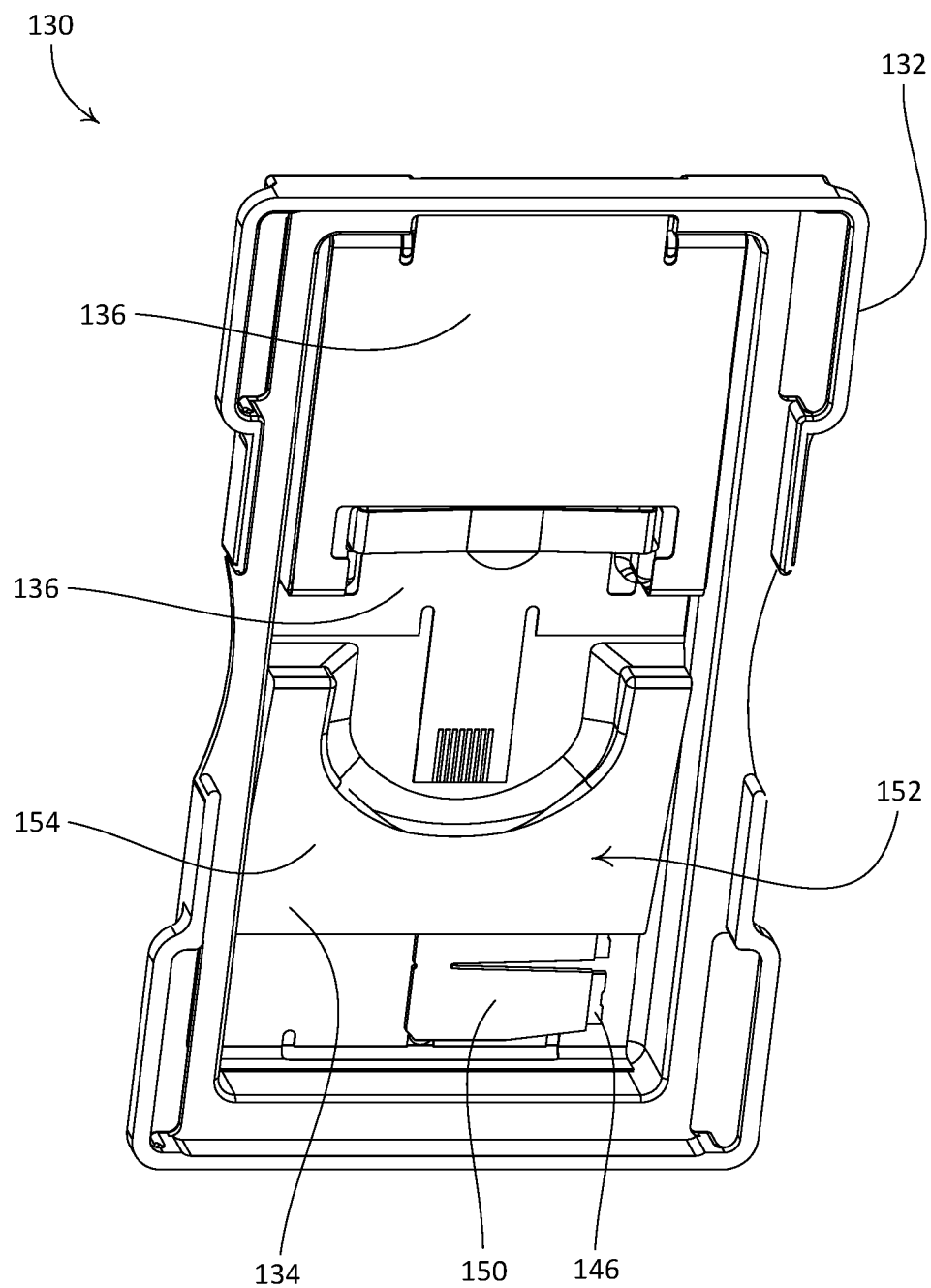
FIG. 4 is a rear perspective view of the control unit component illustrated in FIGS. 3A and 3B, in an assembled configuration.
Figure 5:
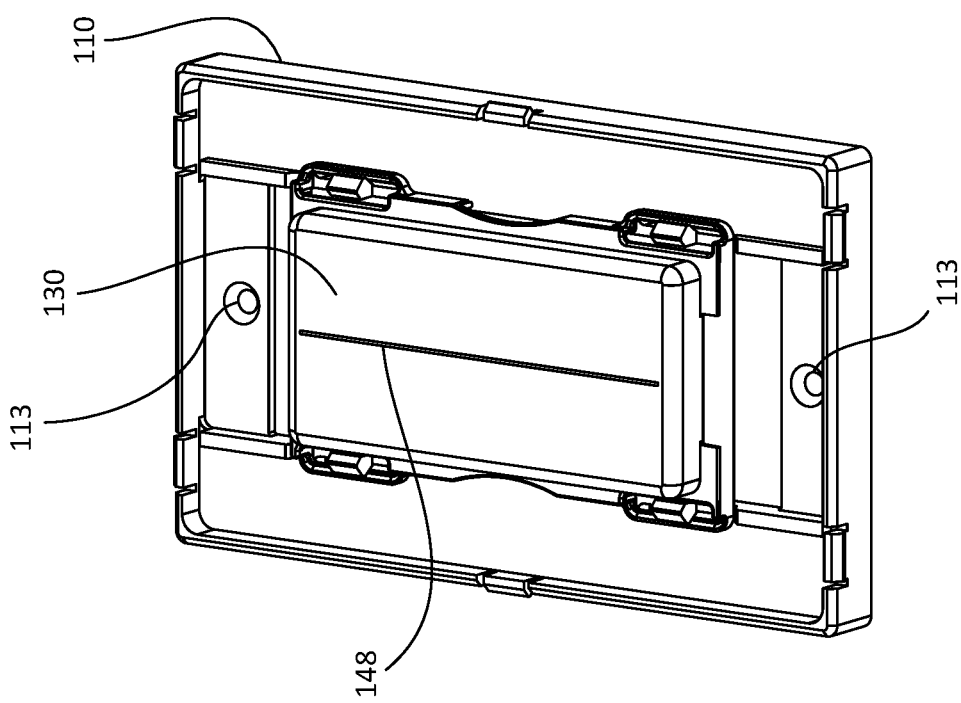
FIG. 5 is a front perspective view of an adapter component and the control unit component of the example remote control device illustrated in FIG. 2.
Figure 8:
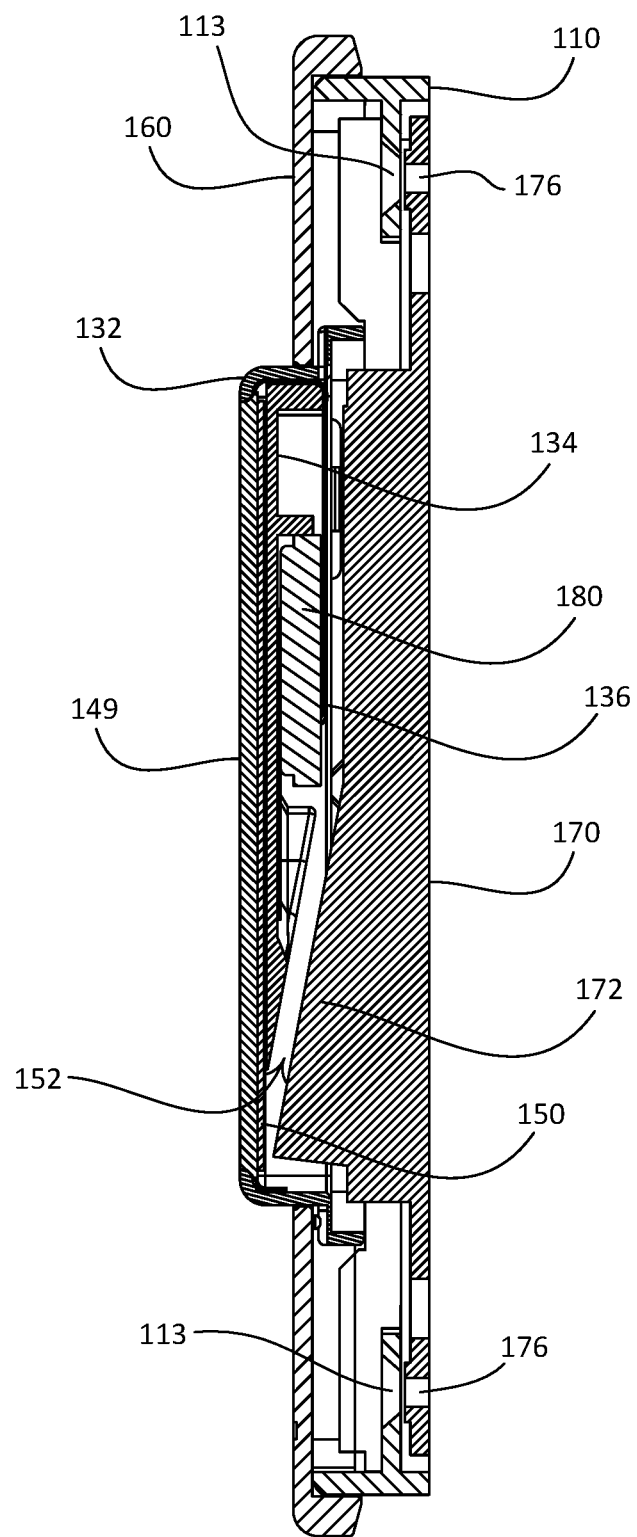
FIG. 8 is a side section view of the example remote control device illustrated in FIG. 1.

The control unit 130 may be configured to be attached to the adapter 110 in multiple orientations, for example in accordance with a position of the actuator 172 of the mechanical switch 170. For example, the insert 134 may be configured to, when received in the void 138 in the cover 132, define a recess 152 (e.g., as shown in FIGS. 4 and 8) that is configured to receive a portion of the actuator 172 of the mechanical switch 170 when the control unit 130 is attached to the adapter 110. As shown, the insert 134 may define a sloped surface 154 that at least partially defines the recess 152. When the control unit 130 is attached to the adapter 110, the control unit 130 may be oriented such that the recess 152 is positioned over, and receives, a portion of the actuator 172 that protrudes from the mechanical switch 170. To illustrate, if the actuator 172 is in a first position, such that the lower portion of the actuator 172 protrudes, the control unit 130 may be oriented such that the recess 152 is positioned to receive the lower portion of the actuator 172. Alternatively, if the actuator 172 is in a second position, such that the upper portion of the actuator 172 protrudes, the control unit 130 may be oriented such that the recess 152 is positioned to receive the upper portion of the actuator 172. In this regard, the control unit 130 may be configured to be attached to the adapter 110 in at least first and second orientations. As shown, the cover 132 of the control unit 130 may define slots 156 that are configured to receive and engage with corresponding ones of the snap fit connectors 116 of the adapter 110, to releasably attach the control unit 130 to the adapter 110. FIG. 5 illustrates the adapter 110 with the control unit 130 attached thereto.

Figure 6:
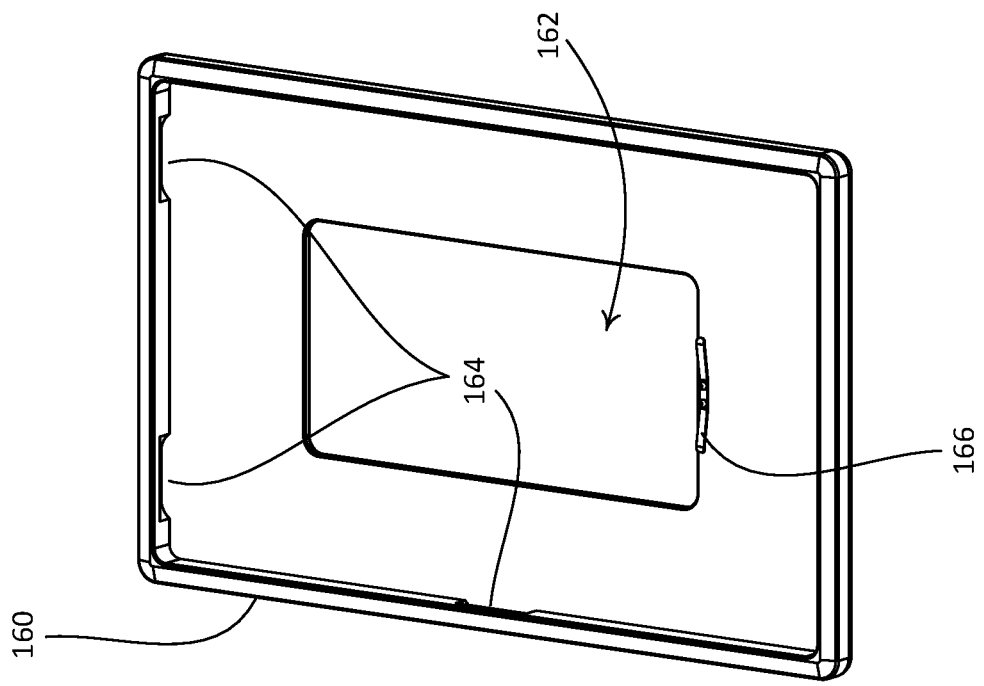
FIG. 6 is a rear perspective view of a faceplate component of the example remote control device illustrated in FIG. 2.

The control unit 130 may be configured to determine an orientation of the control unit 130 relative to the adapter 110. For example, the illustrated control unit 130 may be configured to determine whether the control unit 130 is attached to the adapter 110 in a first orientation in which the recess 152 is located closer to a lower end of the adapter 110, or is attached to the adapter 110 in a second orientation in which the recess 152 is located closer to an upper end of the adapter 110. As shown, the flexible circuit board 136 may define an electrical contact pad 158 that is configured to be received in a recess 135 defined by the cover 132, such that the electrical contact pad 158 is exposed. As shown in FIG. 6, the faceplate 160 may include a shorting member 166 that is located along a lower edge of the opening 162. The faceplate 160 may define one or more markings (not shown) to ensure proper orientation of the faceplate 160, and thus the shorting member 166, when attaching the faceplate 160 to the adapter 110. The control circuit of the control unit 130 may be configured to determine whether the control unit 130 is in the first or second orientation based upon whether or not the shorting member 166 is placed into electrical communication with the electrical contact pad 158 when the faceplate 160 is attached to the adapter 110. In this regard, the control unit 130 may be configured to determine an orientation of the control unit 130 relative to the faceplate 160, and thereby an orientation of the control unit 130 relative to the adapter 110.

The control circuit may use determination of the orientation of the control unit 130 relative to the faceplate 160 and the adapter 110 to determine which end of the array of LEDs 146 should correspond to a high-end intensity (e.g., approximately 100% intensity) and which end of the array of LEDs 146 should correspond to a low-end intensity (e.g., approximately 1% intensity), for example when displaying an indication of the amount of power delivered to an electrical load. The control unit 130 may be configured to, based on the determination of orientation, illuminate one or more of the LEDs 146 such that the high-end intensity corresponds to an upper end of the LED array and such that the low-end intensity corresponds to a lower end of the LED array. In this regard, the control unit 130 may ensure proper indication of the high-end and low-end intensities via the LEDs 146 regardless of whether the control unit 130 is mounted to the adapter 110 in the first orientation or the second orientation (e.g., based on whether the on position of the mechanical switch 170 corresponds to the actuator 172 operated to the up position or to the down position).

It should be appreciated that the control unit 130 is not limited to determining an orientation of the control unit 130 via the electrical contact pad 158 and shorting member 166. For example, the control unit may alternatively include and/or receive orientation information from, for example, a switch that is manually operated to indicate orientation of the control unit, a gravity switch, a gyroscope, an accelerometer, or the like to determine an orientation of the control unit. Alternatively still, an orientation of the control unit may be specified during a configuration process of the control unit, for instance when pairing the remote control device to load control system.

The control circuit may be configured to cause the wireless communication circuit to transmit respective commands that correspond to interpreted gestures received at the capacitive touch surface 140. For example, the remote control device 100 may be operable to transmit wireless signals, for example radio frequency (RF) signals, to a load control device, one or more electrical loads, and/or a central processor of a load control system. The remote control device 100 may be associated with the load control device and the one or more electrical loads during a configuration procedure of the load control system. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The control unit 130 may include an occupancy sensor that may detect when a space in which the remote control device 100 is installed becomes occupied or vacant, and may include an occupancy circuit that is in electrical communication with the occupancy sensor and the control circuit. The control circuit may be configured to cause the wireless communication circuit to transmit respective commands to one or more electrical loads in accordance with information (e.g., signals) received from the occupancy circuit.

The illustrated control unit 130 may be battery-powered. For example, as shown, the insert 134 may define a battery compartment 137 that is configured to retain a battery, for instance the illustrated coin cell battery 180, such that the battery is placed in electrical communication with the flexible circuit board 136, for instance to power the capacitive touch surface 140, the control circuit, the wireless communication circuit, and/or other circuitry of the control unit 130. Alternatively, the control unit 130 may be configured to derive power from a power source connected to the mechanical switch 170, such as source of AC power for example. The faceplate 160 may be configured to store one or more spare batteries 180, for example in a void defined between an inner surface of the faceplate 160 and the adapter 110.

Referring now to FIGS. 7A-7C, the adapter 110, the control unit 130, and/or the faceplate 160 may be configured so as to be staggered relative to a surface of a structure to which the mechanical switch 170 is installed, such as a wallboard surface that surrounds a wallbox in which the mechanical switch 170 is installed. For example, when the adapter is attached to the yoke 174 of the mechanical switch 170 and the control unit 130 and the faceplate 160 are attached to the adapter 110, the rear surface 163 of the faceplate 160 may be spaced from the rear surface 114 of the adapter 110 that abuts a structural surface (e.g., wallboard surface) through a first distance D1 such that the faceplate 160 is spaced from the structural surface. Additionally, the front surface 161 of the faceplate 160 may be spaced from the rear surface 163 of the faceplate 160 through a second distance D2, and the outer surface 144 of the control unit 130 is spaced from the front surface 161 of the faceplate 160 through a third distance D3. As shown, the first distance D1, the second distance D2, and the third distance D3 may be substantially equal to each other. However it should be appreciated that one or more of the adapter 110, the control unit 130, and/or the faceplate 160 may be otherwise configured such that one or more of the first, second, and third distances D1, D2, D3 are different from each other.

Figure 9:
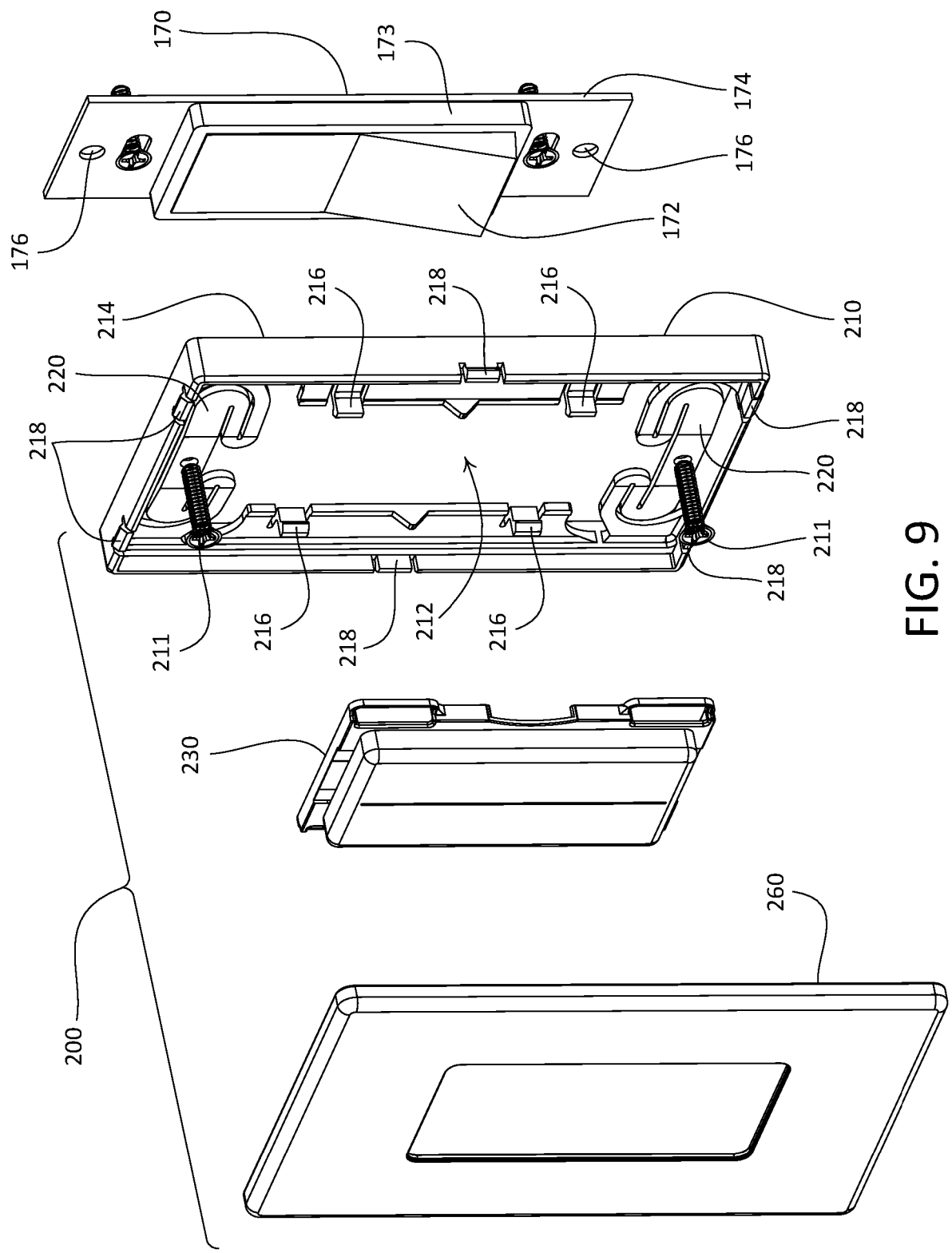
FIG. 9 is a perspective view of another example remote control device.
Figure 10B:
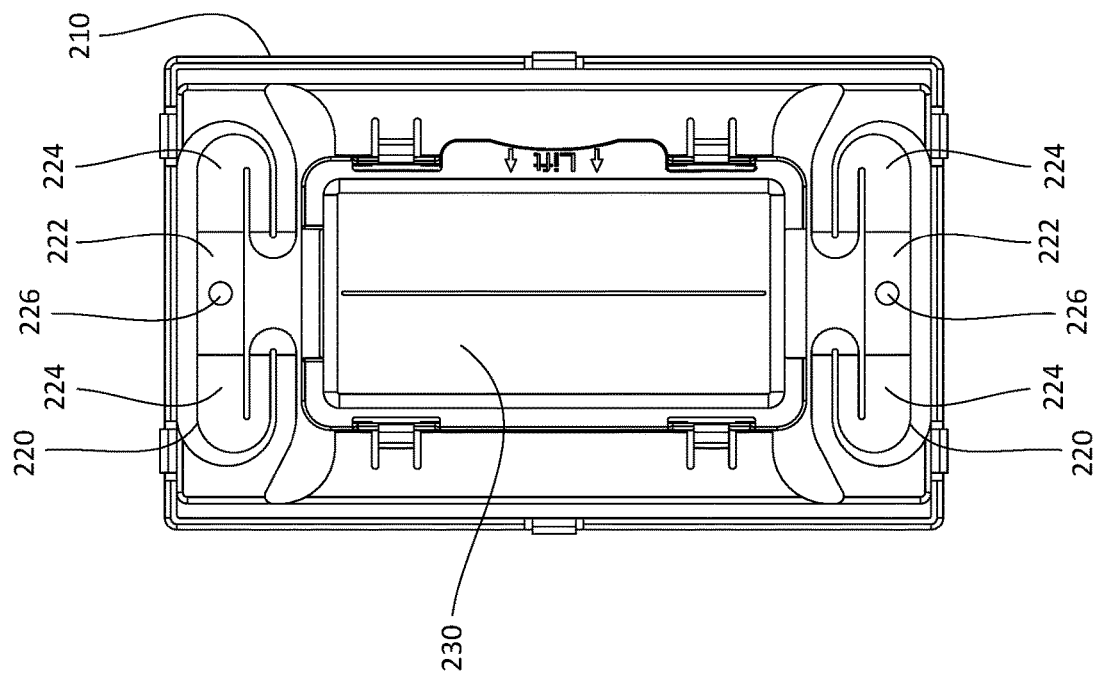
FIG. 10B is a front view of the adapter and control unit components of the example remote control device illustrated in FIG. 9.
Figure 10A:
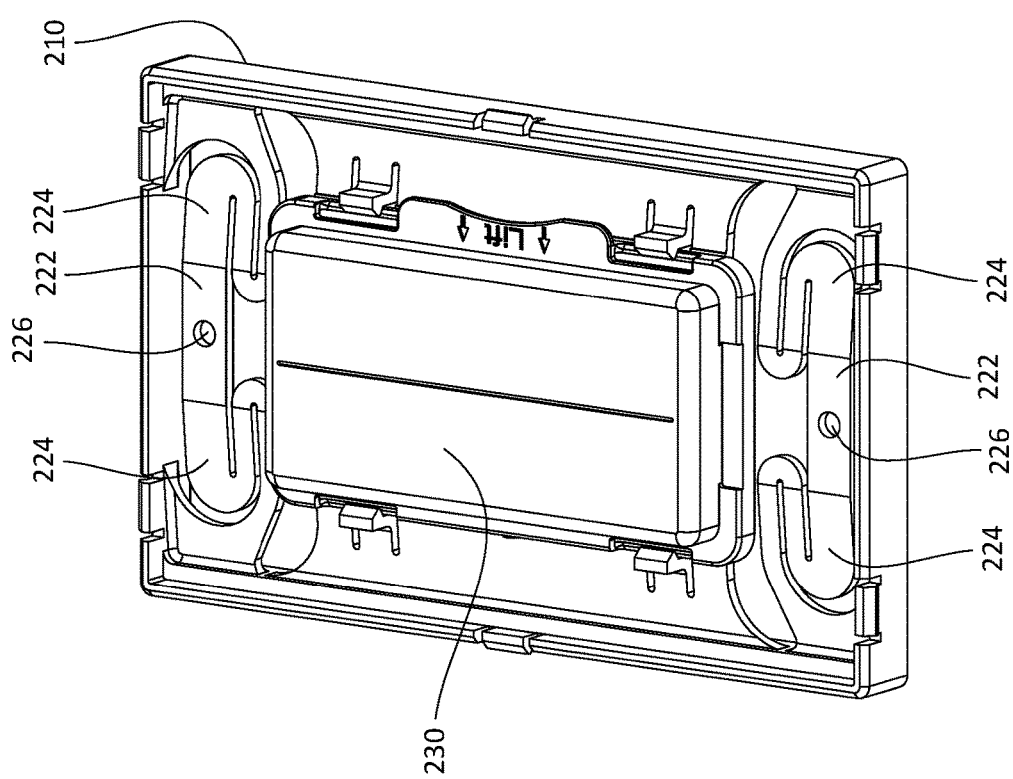
FIG. 10A is a front perspective view of an adapter component and a control unit component of the example remote control device illustrated in FIG. 9.
Figure 10C:
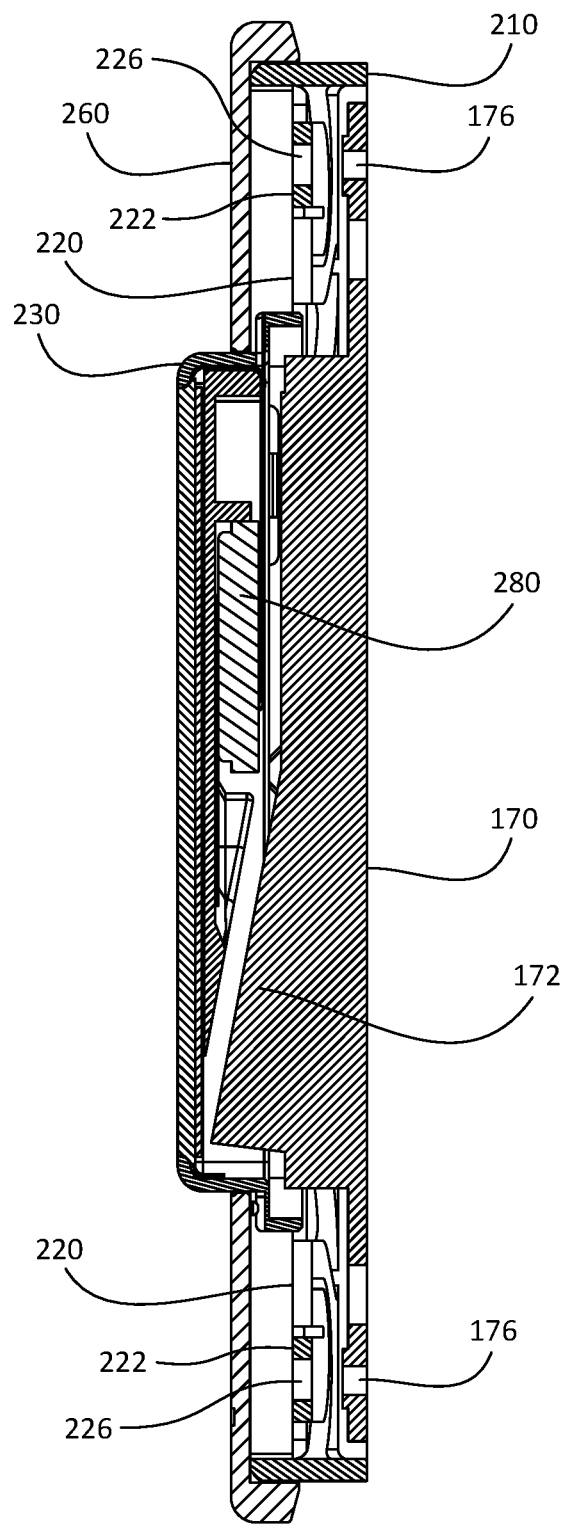
FIG. 10C is a side section view of the example remote control device illustrated in FIG. 9.

FIG. 9 depicts another example remote control device 200 that may be installed in a load control system, such as a lighting control system. The remote control device 200 may be installed, for example, in the above-described load control system that includes the mechanical switch 170. As shown, the example remote control device 200 may include an adapter 210, a control unit 230, and a faceplate 260. The control unit 230 and the faceplate 260 may be constructed identically to the control unit 130 and the faceplate 160, respectively, of the remote control device 100. The circuitry of the control unit 230 may be powered by a battery 280, for example as shown in FIG. 10C.

Prior to installation of the remote control device 200, a pre-existing faceplate (not shown) may be removed from the mechanical switch 170, for instance by removing faceplate screws (not shown) from corresponding faceplate screw holes 176 in the yoke 174. The adapter 210 may be made of any suitable material, such as plastic. The adapter 210 may be configured to be attached to the yoke 174 of the mechanical switch 170. For example, the adapter 210 may be secured to the yoke 174 using fasteners, such as screws 211 that are installed into the faceplate screw holes 176 in the yoke 174.

As shown, the adapter 210 may define an opening 212 that extends therethrough. The opening 212 may be configured to receive a portion of the mechanical switch 170 that may include, for example, the actuator 172 and a bezel 173 that surrounds a perimeter of the actuator 172. The adapter 210 may define a rear surface 214 that is configured to abut a surface of a structure to which the mechanical switch 170 is installed, such as a wallboard surface that surrounds a wallbox in which the mechanical switch 170 is installed.

The adapter 210 may be configured to enable removable attachment of the control unit 230 to the adapter 110. For example, the adapter 210 may define one or more attachment members that are configured to engage with complementary features of the control unit 230. As shown, the adapter 210 may define one or more resilient snap fit connectors 216 that are configured to engage with complementary features of the control unit 230. The adapter 210 may be configured to enable removable attachment of the faceplate 260 to the adapter 210. For example, the adapter 210 may define one or more attachment members that are configured to engage with complementary features of the faceplate 260. As shown, the adapter 210 may define one or more resilient snap fit connectors 218 that are configured to engage with complementary features of the faceplate 260.

As shown in 10A-10C, the adapter 210 may be configured to bias the rear surface 214 of the adapter 210 against a surface of a structure to which the mechanical switch 170 is installed, such as a wallboard surface that surrounds a wallbox in which the mechanical switch 170 is installed. For example, as shown, the adapter 210 defines a pair of resilient biasing members 220 that are configured to bias the rear surface 214 of the adapter 210 against the surface of the structure as the biasing members 220 are fastened to the yoke 174 of the mechanical switch 170. Each biasing member 220 includes a plate 222 that is suspended from the adapter 210 by resilient spring arms 224, such that the plate 222 is spaced outward relative to the rear surface 214 of the adapter 210. Each plate 222 defines an aperture 226 that is configured to receive a corresponding one of the screws 211. As the adapter 210 is attached to the yoke 174 of the mechanical switch 170, the screws 211 may pull the plates 222 toward the surface of the structure, which may cause the spring arms 224 to bias the rear surface 214 of the adapter 210 against the surface of the structure. In this regard, the adapter 210 may operate to compensate for abnormalities in the surface of the structure, such as unevenness for example.

Figure 11:
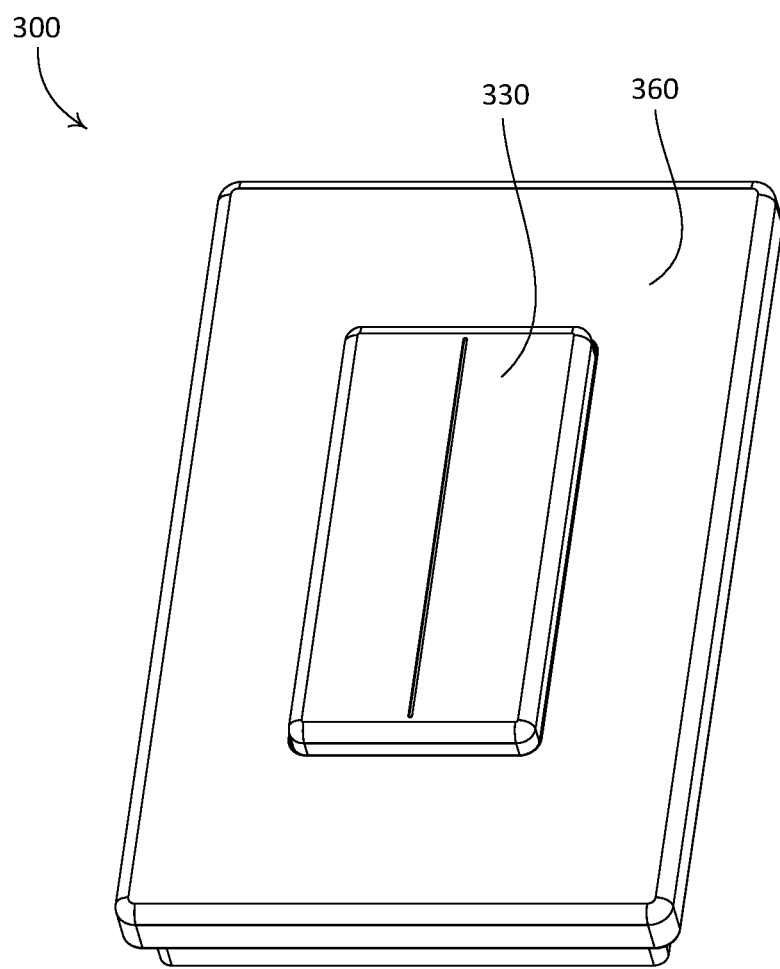
FIG. 11 is a perspective view of still another example remote control device.
Figure 12:
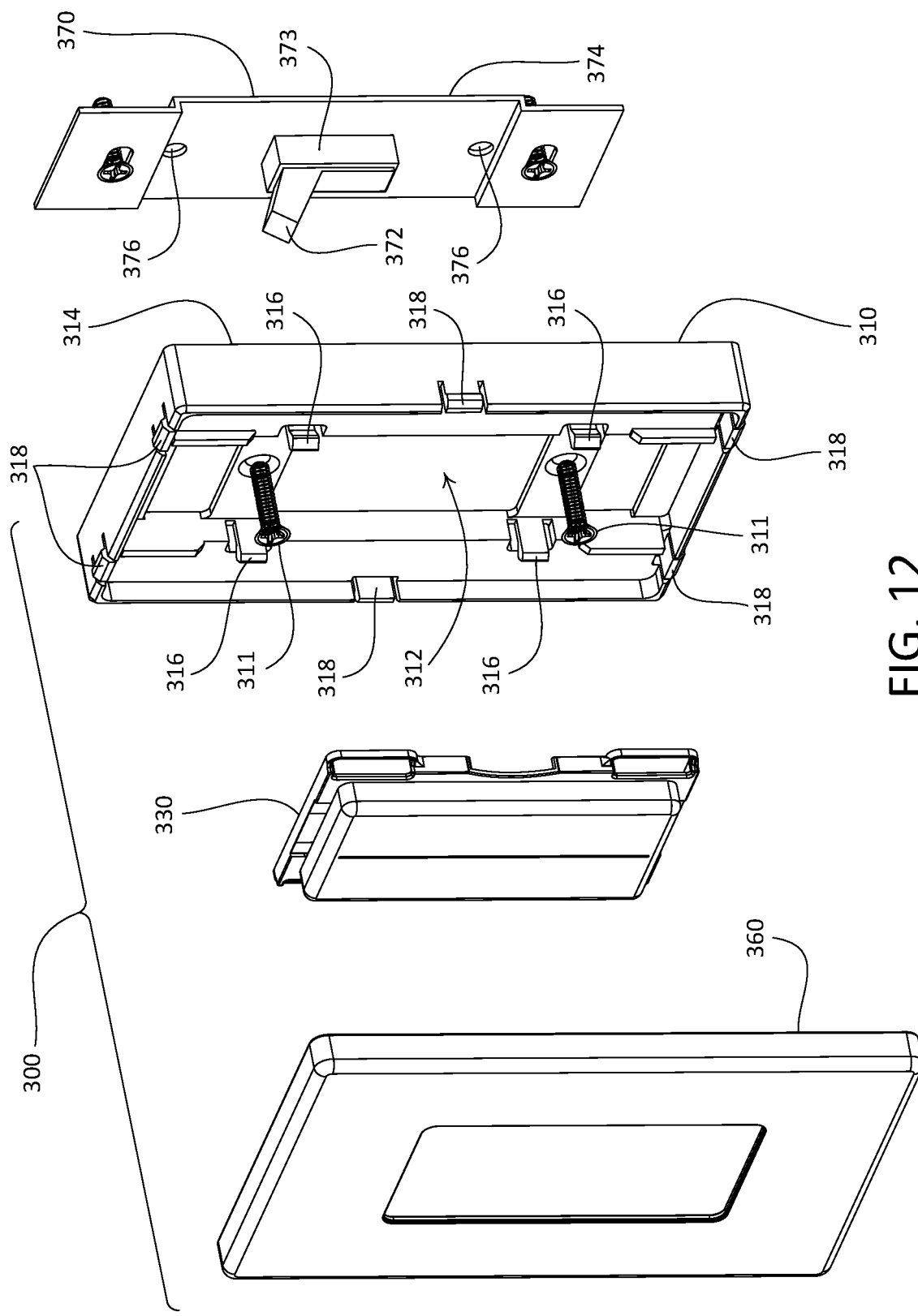
FIG. 12 is an exploded view of the example remote control device illustrated in FIG. 11.
Figure 13C:
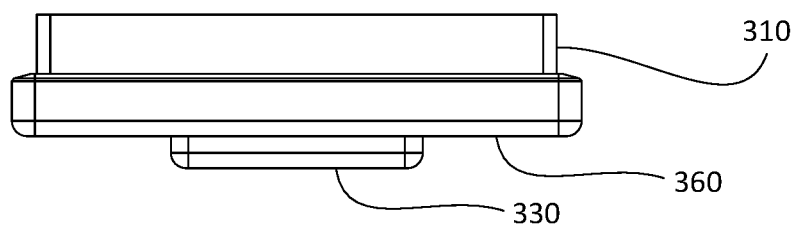
FIG. 13C is a top view of the example remote control device illustrated in FIG. 11.
Figure 13A:
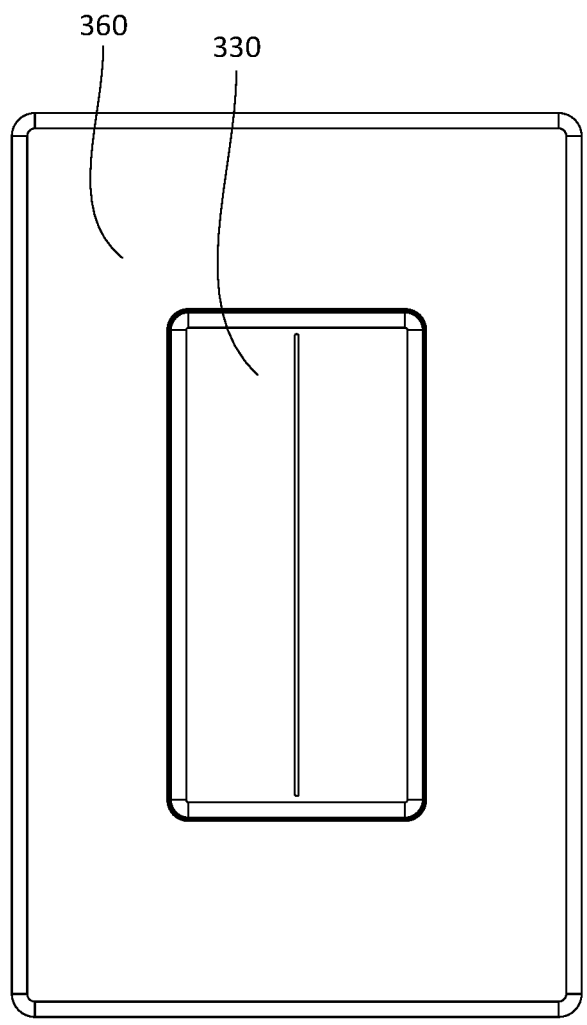
FIG. 13A is a front view of the example remote control device illustrated in FIG. 11.
Figure 13B:
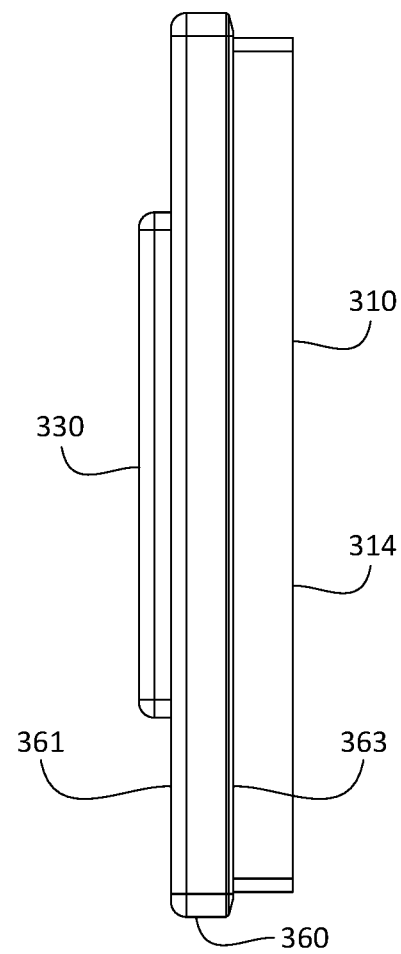
FIG. 13B is a side view of the example remote control device illustrated in FIG. 11.

FIGS. 11 and 12 depict another example remote control device 300 that may be installed in a load control system, such as a lighting control system. The load control system may include a mechanical switch 370 that may be in place prior to installation of the remote control device 300, for example pre-existing in the load control system. As shown, the mechanical switch 370 may be a standard single pole single throw (SPST) maintained switch. The load control system may further include one or more electrical loads, such as lighting loads. The mechanical switch 370 may be coupled in series electrical connection between an alternating current (AC) power source and the one or more electrical loads. The mechanical switch 370 may include an actuator 372 that may be actuated to turn on and/or turn off, the one or more electrical loads. The mechanical switch 370 may include a yoke 374 that enables mounting of the mechanical switch 370 to a structure. For example, the yoke 374 may be fastened to a single-gang wallbox that is installed in an opening of a wall.

The load control system may further include a load control device that is electrically connected to the one or more electrical loads. The load control device may include a load control circuit for controlling the intensity of one or more of the electrical loads between a low end intensity (e.g., approximately 1%) and a high-end intensity (e.g., approximately 100%), and may include a wireless communication circuit. In an example implementation, the load control device may be a standalone dimmer switch that is electrically connected to the one or more electrical loads. In another example implementation, each of the one more electrical loads may include a respective integrated load control circuit and wireless communication circuit, such that each electrical load includes a corresponding load control device that is configured for wireless communication. It should be appreciated that the load control system is not limited to the example load control devices described herein.

As shown, the example remote control device 300 may include an adapter 310, a control unit 330, and a faceplate 360. The control unit 330 may be constructed identically to the control units 130 and 230 of the remote control devices 100 and 200, respectively. The faceplate 360 may be constructed similarly to the faceplate 160 the remote control device 100. For example, the faceplate may define a front surface 361 and an opposed rear surface 363. However, the faceplate 360 may differ from the faceplate 160 in that the faceplate 360 may define a thicker side profile than the faceplate 160, such that the front and rear surfaces 361, 363 of the faceplate 360 are spaced further apart from each other than are the front and rear surfaces 161, 163 of the faceplate 160. The adapter 310 may be constructed similarly to the adapter 110 of the remote control device 100. However, the adapter 310 may define a thicker side profile than the adapter 110.

Prior to installation of the remote control device 300, a pre-existing faceplate (not shown) may be removed from the mechanical switch 370, for instance by removing faceplate screws (not shown) from corresponding faceplate screw holes 376 in the yoke 374. The adapter 310 may be configured to be attached to the yoke 374 of the mechanical switch 170. For example, the adapter 310 may be secured to the yoke 374 using fasteners, such as screws 311 that are installed into the faceplate screw holes 376 in the yoke 374. As shown, the adapter 310 may define an opening 312 that extends therethrough. The opening 312 may be configured to receive a portion of the mechanical switch 370 that may include, for example, the actuator 372 and a bezel 373 that surrounds a perimeter of the actuator 372. The adapter 310 may define a rear surface 314 that is configured to abut a surface of a structure to which the mechanical switch 370 is installed, such as a wallboard surface that surrounds a wallbox in which the mechanical switch 370 is installed.

The adapter 310 may be configured to enable removable attachment of the control unit 330 to the adapter 310. For example, the adapter 310 may define one or more attachment members that are configured to engage with complementary features of the control unit 330. As shown, the adapter 310 may define one or more resilient snap fit connectors 316 that are configured to engage with complementary features of the control unit 330. The adapter 310 may be configured to enable removable attachment of the faceplate 360 to the adapter 310. For example, the adapter 310 may define one or more attachment members that are configured to engage with complementary features of the faceplate 360. As shown, the adapter 310 may define one or more resilient snap fit connectors 318 that are configured to engage with complementary features of the faceplate 360.

Figure 14:
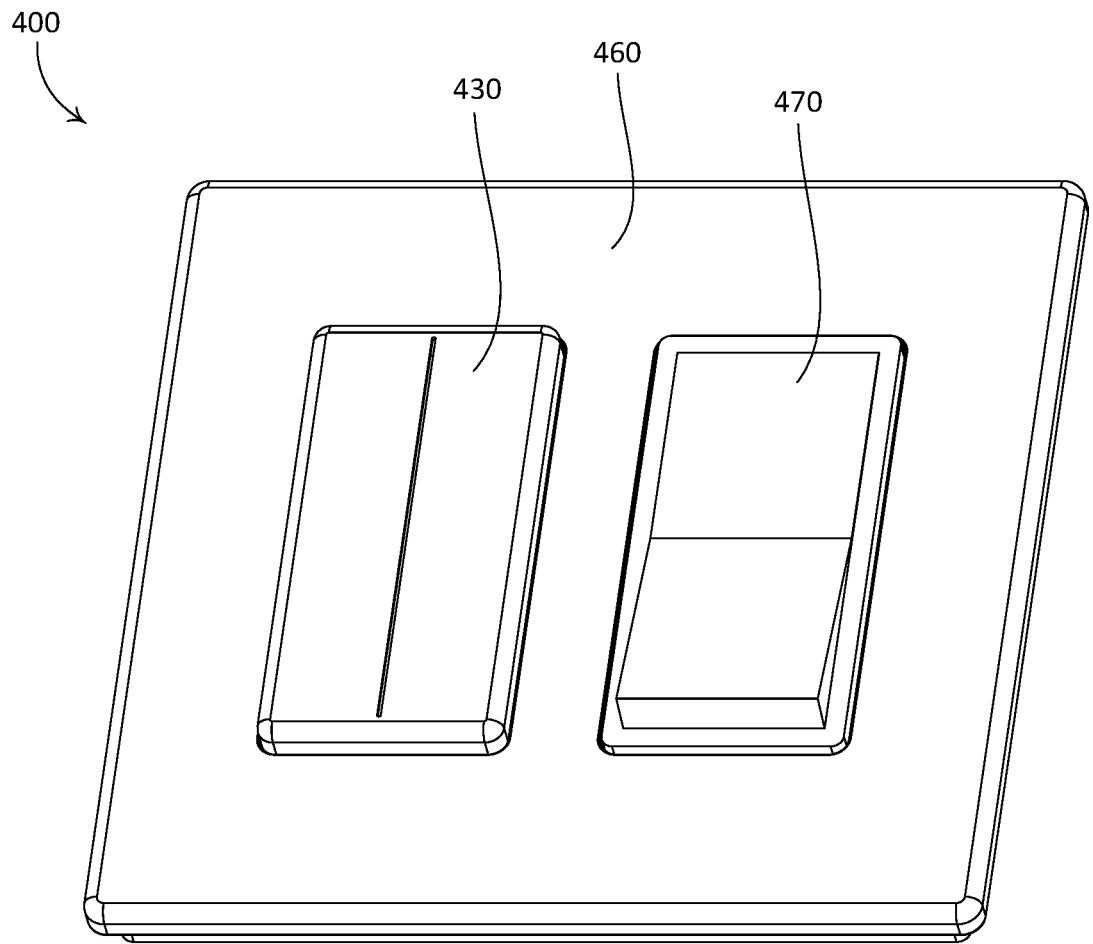
FIG. 14 is a perspective view of still another example remote control device.
Figure 15:
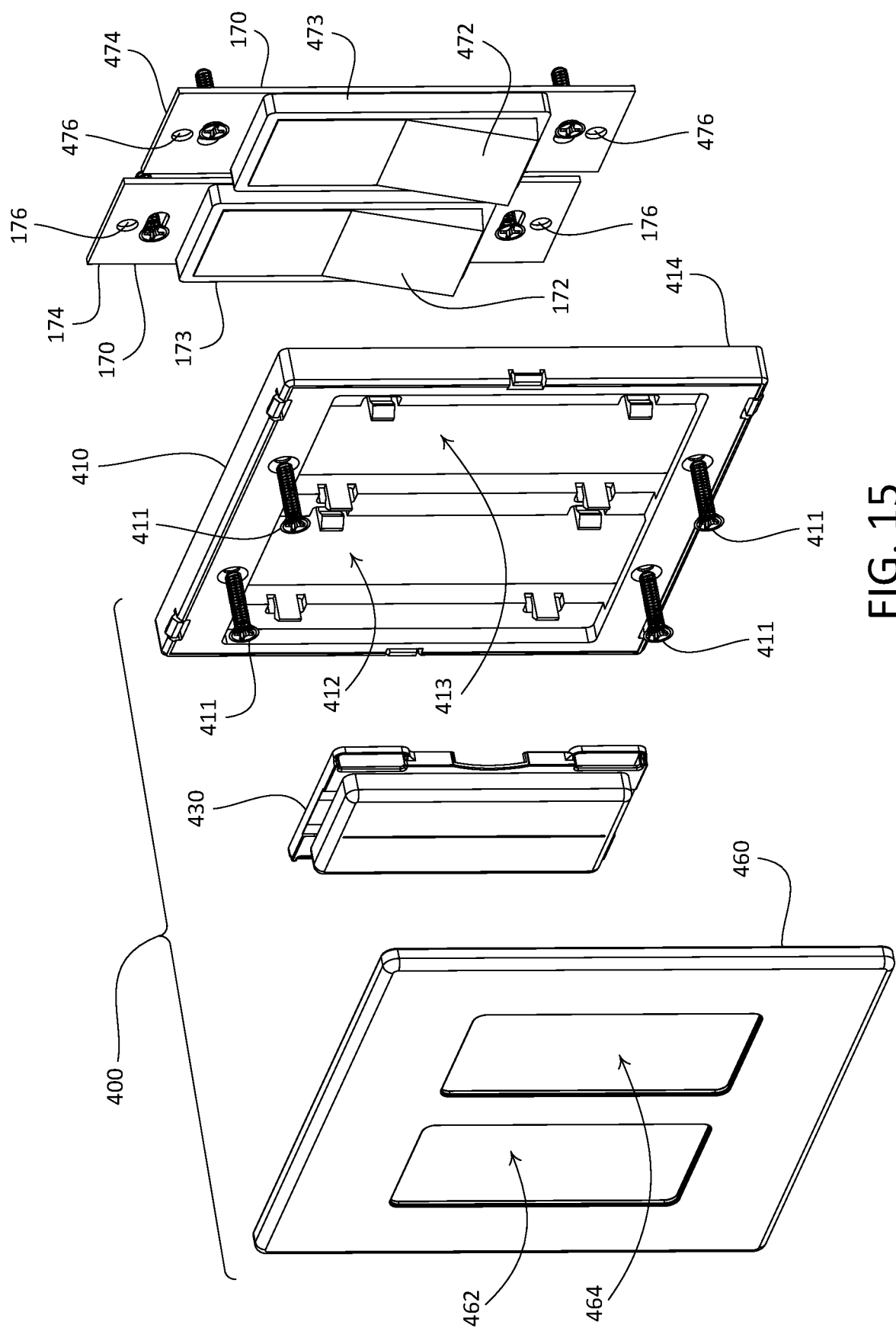
FIG. 15 is an exploded view of the example remote control device illustrated in FIG. 14.

FIGS. 14 and 15 depict another example remote control device 400 that may be installed in a load control system, such as a lighting control system. The remote control device 400 may be installed, for example, in the above-described load control system that includes the mechanical switch 170, which may be referred to as a first mechanical switch, and that further includes a second electrical device, such as a second mechanical switch 470. The first and second mechanical switches 170, 470 may be installed, for example, in a multi-gang wallbox (e.g., a double-gang wallbox) that is installed in an opening of a wall. It should be appreciated that the second electrical device is not limited to a second mechanical switch. For example, the second electrical device could alternatively be an electrical outlet, or another type of electrical device that is configured to be installed for use with a faceplate having a decorator style opening.

As shown, the example remote control device 400 may include an adapter 410, a control unit 430, and a faceplate 460. The control unit 430 may be constructed identically to the control units 130, 230, and 330 of the example remote control devices 100, 200, and 300, respectively. The adapter 410 and the faceplate 460 may be constructed similarly to the adapter 110 and the faceplate 160, with the below-described differences in configuration for use in a double-gang implementation.

Prior to installation of the remote control device 400, a pre-existing faceplate (not shown) may be removed from the first and second mechanical switches 170, 470, for instance by removing faceplate screws (not shown) from corresponding faceplate screw holes 176, 476 in the yokes 174, 474 of the first and second mechanical switches 170, 470, respectively. The adapter 410 may be made of any suitable material, such as plastic. The adapter 410 may be configured to be attached to the yoke 174 of the first mechanical switch 170 and to the yoke 474 of the second mechanical switch 470. For example, the adapter 410 may be secured to the yokes 174, 474 using fasteners, such as screws 111 that are installed into the faceplate screw holes 176, 476 of the yokes 174, 474.

As shown, the adapter 410 may define first and second openings 412, 413 that extend therethrough. The first and second openings 412, 413 may be configured to receive respective portions of the first and second mechanical switches 170, 470 that may include, for example, the actuators 172, 472 and corresponding bezels 173, 473 that surround respective perimeters of the actuators 172, 472. The adapter 410 may define a rear surface 414 that is configured to abut a surface of a structure to which the first and second mechanical switches 170, 470 are installed, such as a wallboard surface that surrounds a double-gang wallbox in which the first and second mechanical switches 170, 470 are installed.

Figure 16:
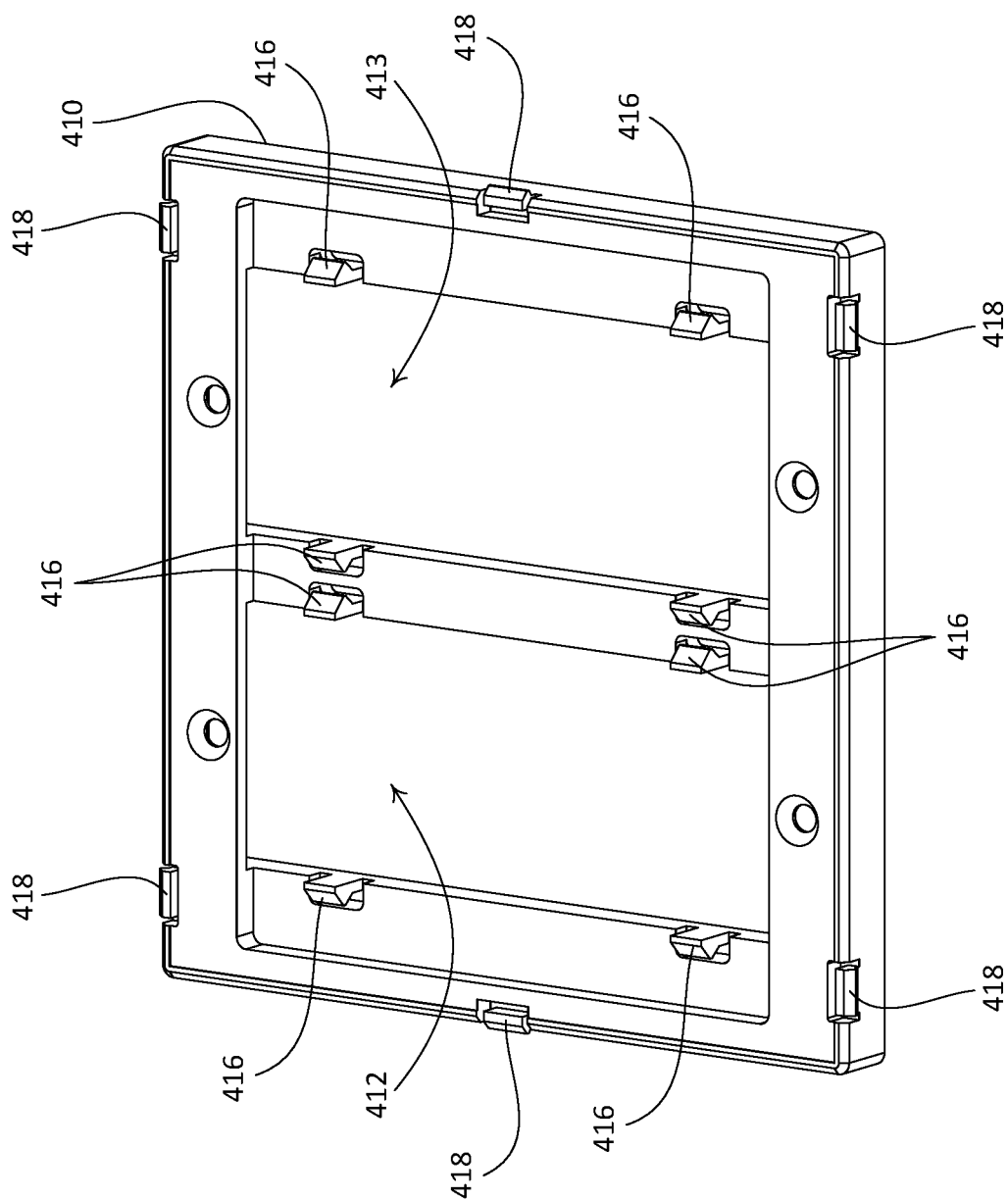
FIG. 16 is a front perspective view of an adapter component of the example remote control device illustrated in FIG. 15.

As shown in FIG. 16, the adapter 410 may be configured to enable removable attachment of the control unit 430 to the adapter 410. For example, the adapter 410 may define one or more attachment members that are configured to engage with complementary features of the control unit 430. As shown, the adapter 410 may define one or more resilient snap fit connectors 416 that are configured to engage with complementary features of the control unit 430. The illustrated adapter 410 is configured with snap fit connectors 416 such that the control unit 430 may be attached to the adapter over the first opening 412 or the second opening 413. Alternatively, two control units could be attached to the adapter 410, over the first and second openings 412, 413 respectively. The adapter 410 may be configured to enable removable attachment of the faceplate 460 to the adapter 410. For example, the adapter 410 may define one or more attachment members that are configured to engage with complementary features of the faceplate 460. As shown, the adapter 410 may define one or more resilient snap fit connectors 418 that are configured to engage with complementary features of the faceplate 460.

Figure 17:
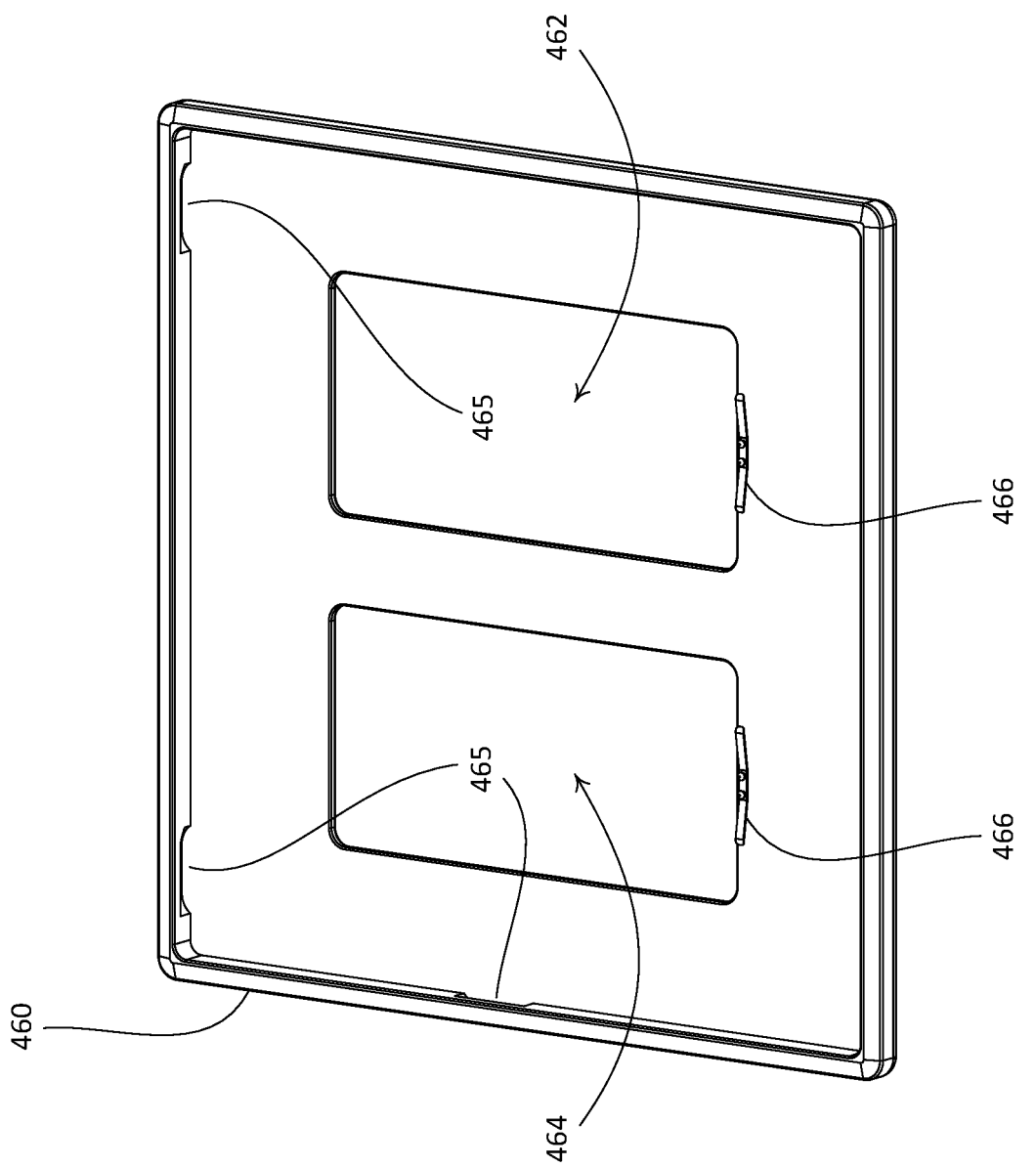
FIG. 17 is a rear perspective view of a faceplate component of the example remote control device illustrated in FIG. 15.

The faceplate 460 may define a front surface 461 and an opposed rear surface 463. The front surface 461 may alternatively be referred to as an outer surface of the faceplate 460, and the rear surface 463 may alternatively be referred to as an inner surface of the faceplate 460. As shown in FIG. 17, the faceplate 460 may define respective first and second openings 462, 464 therethrough that are configured to receive a portion of the control unit 430, such that the control unit 430 protrudes proud of the faceplate 460 when the remote control device 400 is in an assembled configuration. As shown, the faceplate 460 may define recessed ledges 465 that are configured to engage with corresponding ones of the snap fit connectors 418 of the adapter 410, to releasably attach the faceplate 460 to the adapter 410. The faceplate 460 may be made of any suitable material, such as plastic. The faceplate 460 may include a first shorting member 466 that is located along a lower edge of the first opening 462 and a second shorting member 466 that is located along a lower edge of the second opening 464. This may enable the control unit 430 to determine an orientation of the control unit 430 relative to the faceplate 460, and thereby an orientation of the control unit 430 relative to the adapter 410, whether the control unit 430 is installed over the first or second openings 412, 413 of the adapter 410.

Figure 18:
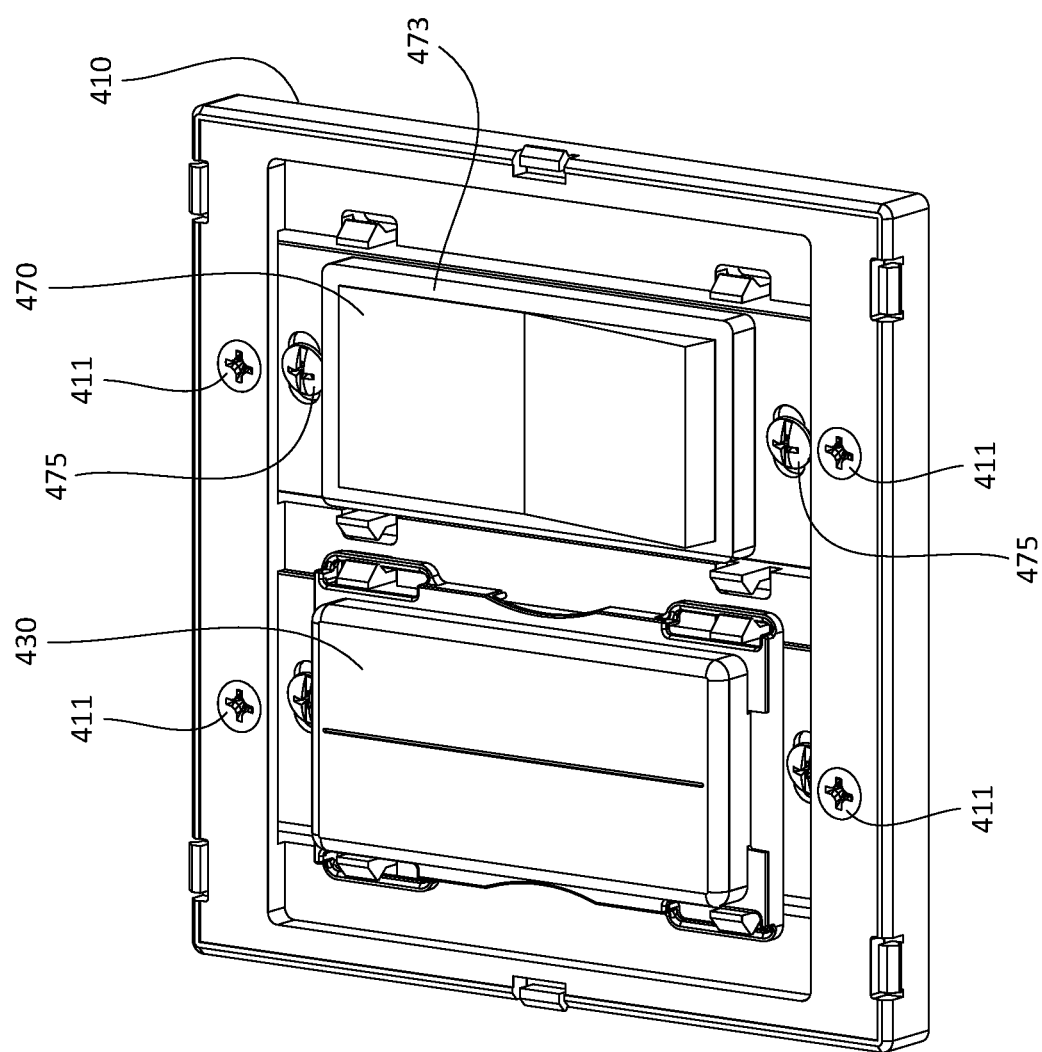
FIG. 18 is a front perspective view of the adapter component illustrated in FIG. 16, with a control unit component of the example remote control device illustrated in FIG. 15 attached thereto.
Figure 19B:
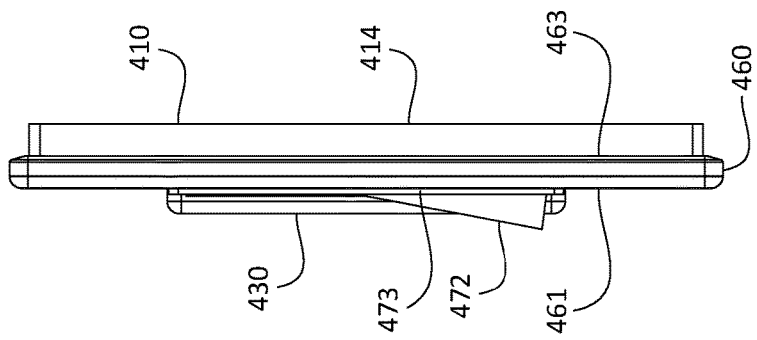
FIG. 19B is a side view of the example remote control device illustrated in FIG. 14.
Figure 19C:
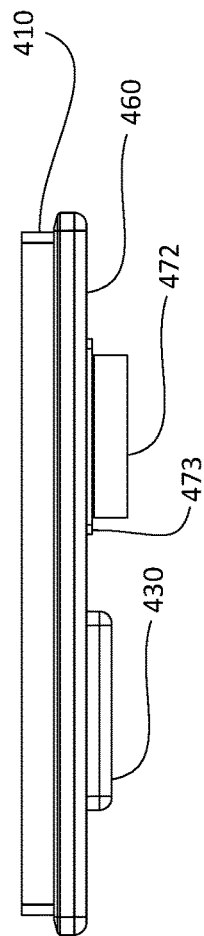
FIG. 19C is a top view of the example remote control device illustrated in FIG. 14.
Figure 19A:
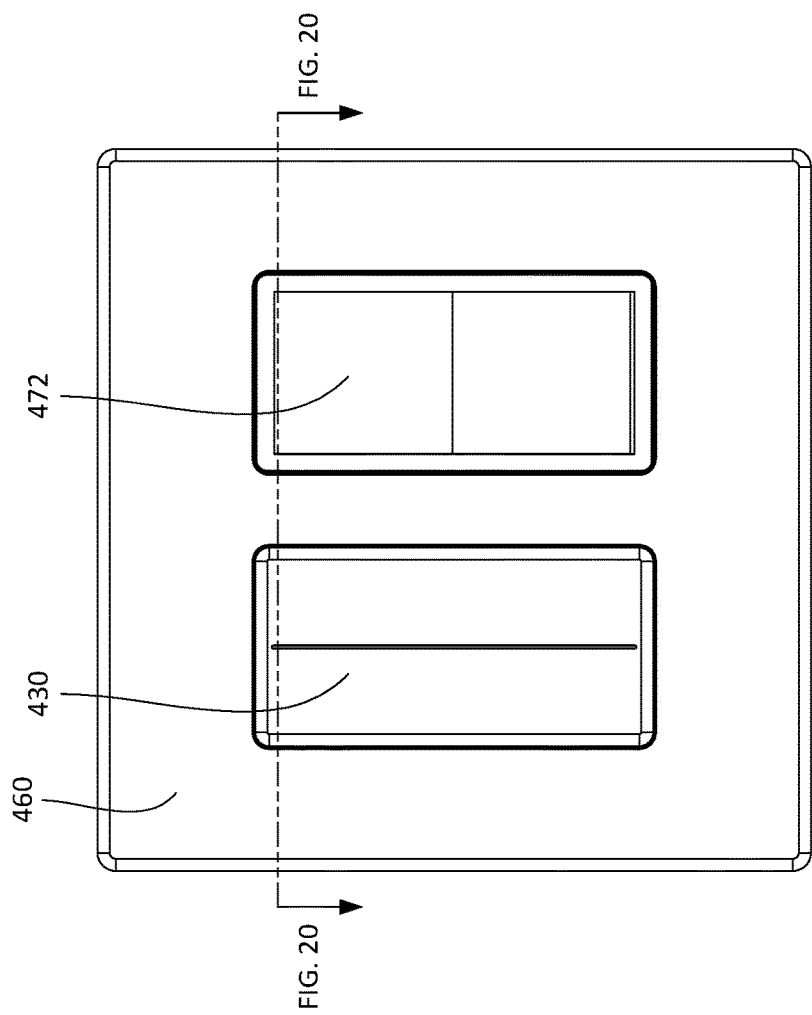
FIG. 19A is a front view of the example remote control device illustrated in FIG. 14.
Figure 20:
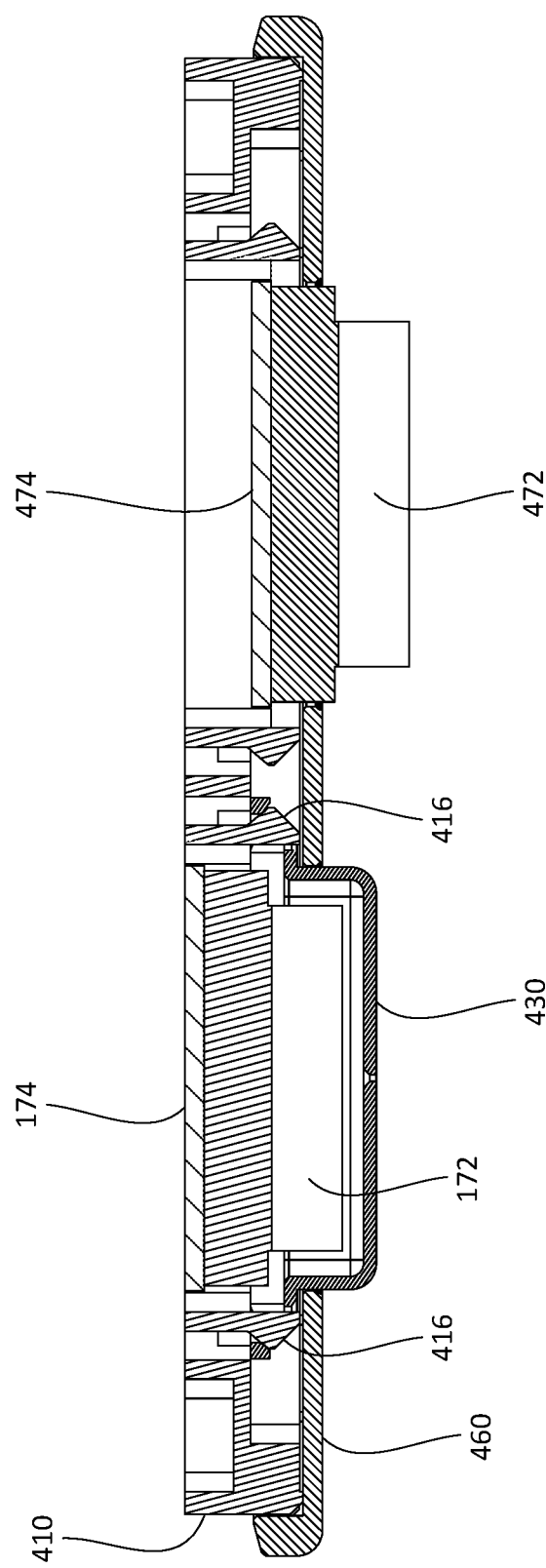
FIG. 20 is a top section view of the example remote control device illustrated in FIG. 14.

FIG. 18 illustrates the adapter 410 with the control unit 430 attached thereto over the first opening 412, and thus over the first mechanical switch 170. Before installation of the remote control device 400, an original installed position of the second mechanical switch 470 (e.g., with the yoke 474 screwed to the double-gang wallbox) may cause the actuator 472 and the bezel 473 of the second mechanical switch 470 to be recessed relative to the front surface 461 of the faceplate 460. However, during attachment of the adapter 410 to the yoke 474 of the second mechanical switch 470, screws 475 that secure the yoke 474 to the double-gang wallbox may be loosened. With the screws 475 loosened, the screws 411 that correspond to the second opening 413 may be tightened, which may draw the yoke 474 of the second mechanical switch 470 outward relative to the double-gang wallbox and toward a front surface of the adapter 410. The process of loosening the screws 475, followed by tightening the screws 411, may be repeated until the yoke 474 of the second mechanical switch 470 is moved outward sufficiently such that the bezel 473 is substantially flush with, or protrudes proud of, the front surface 461 of the faceplate 460 when the faceplate 460 is attached to the adapter, for instance as shown in FIGS. 19B and 19C. In this regard, the adapter 410 may be configured to enable adjustment of the yokes 174, 474 of the first and second mechanical switches 170, 470, respectively, toward and away from the double-gang wallbox, and toward or away from the front surface 461 of the faceplate 460.

Figure 21:
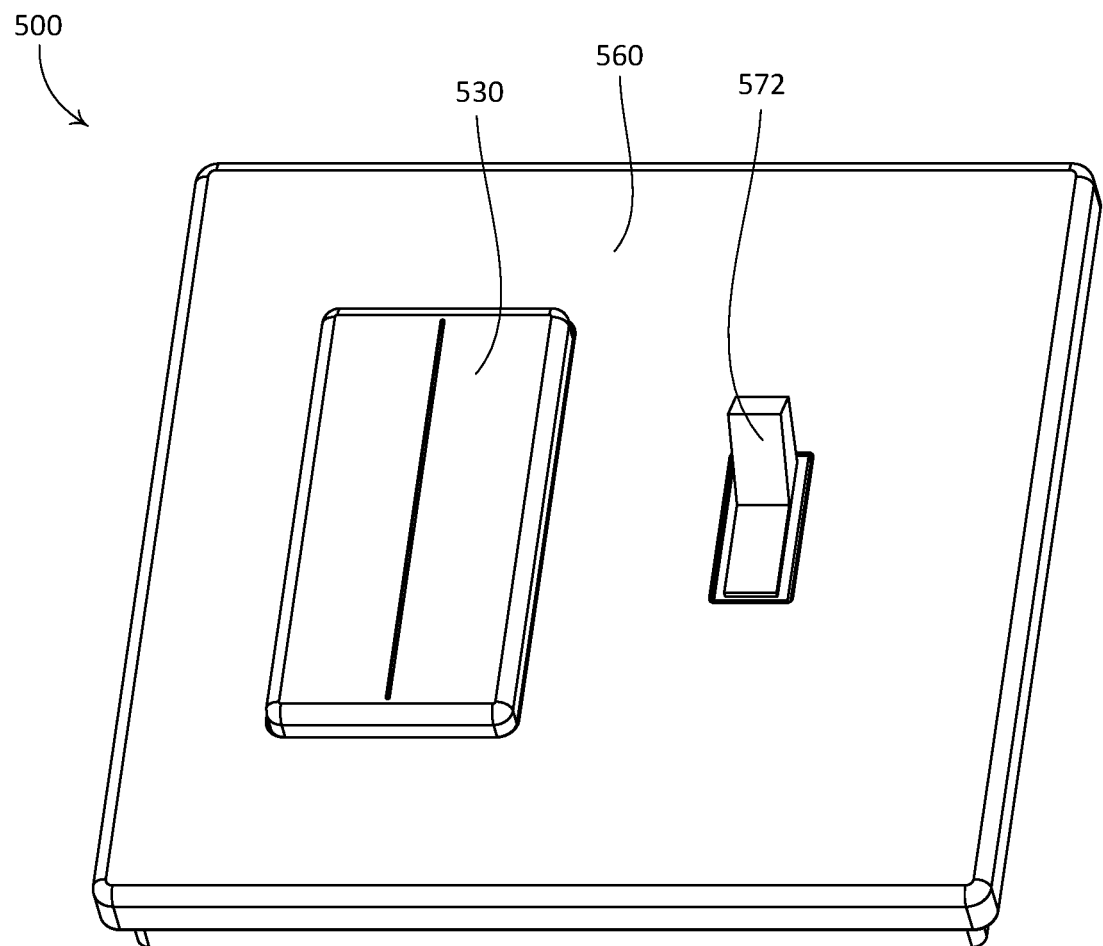
FIG. 21 is a perspective view of still another example remote control device.
Figure 22:
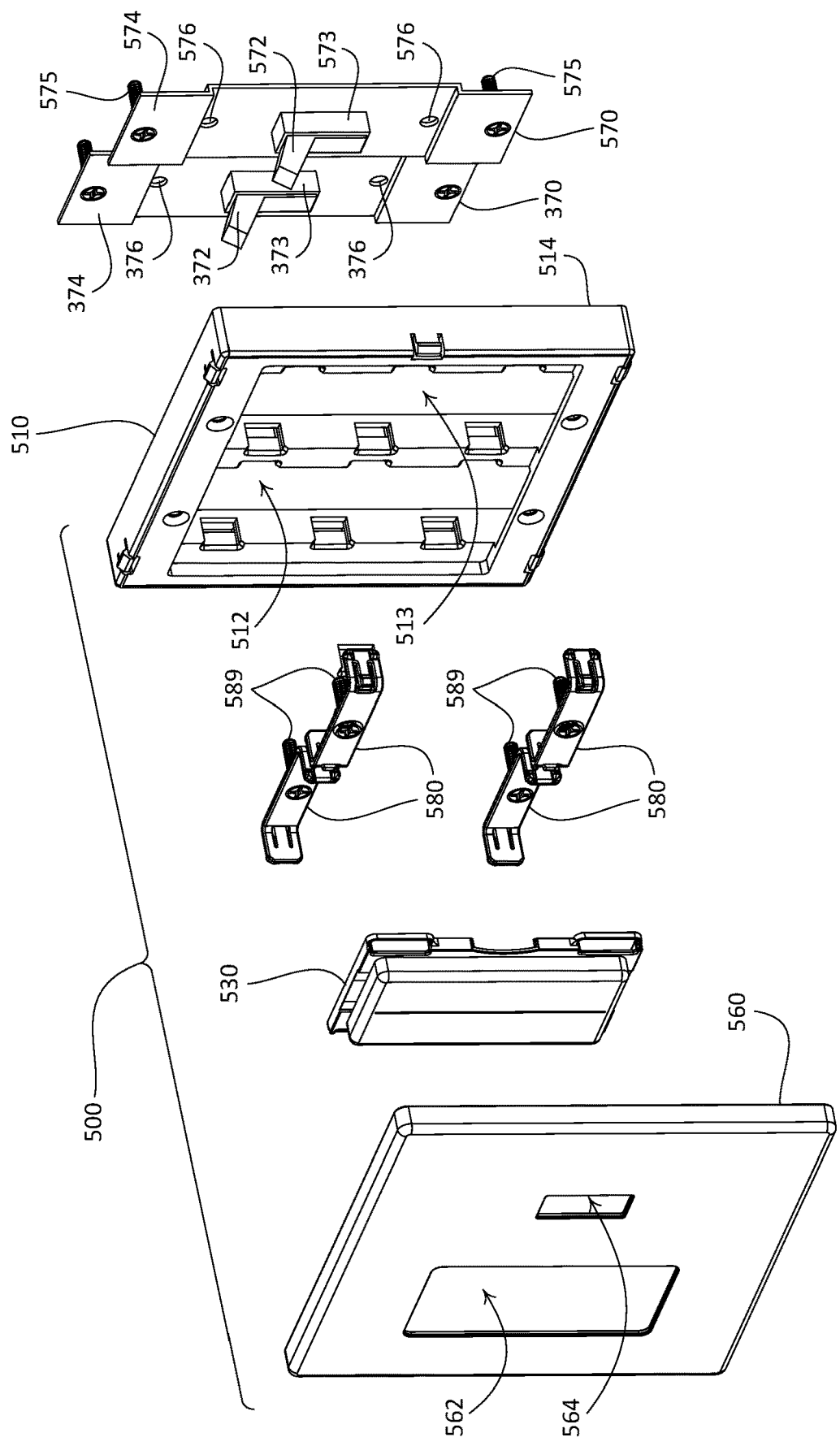
FIG. 22 is an exploded view of the example remote control device illustrated in FIG. 21.

FIGS. 21 and 22 depict another example remote control device 500 that may be installed in a load control system, such as a lighting control system. The remote control device 500 may be installed, for example, in the above-described load control system that includes the mechanical switch 370, which may be referred to as a first mechanical switch, and that further includes a second electrical device, such as a second mechanical switch 570. The first and second mechanical switches 370, 570 may be installed, for example, in a double-gang wallbox that is installed in an opening of a wall. It should be appreciated that the second electrical device is not limited to a second mechanical switch. For example, the second electrical device could alternatively be an electrical outlet, or another type of electrical device.

As shown, the example remote control device 500 may include an adapter 510, a control unit 530, a faceplate 560, and one or more attachment members 580. The control unit 530 may be constructed identically to the control units 130, 230, 330, and 430 of the example remote control devices 100, 200, 300, and 400, respectively. A mounting frame assembly may be provided that includes, for example, the adapter 510 and one or more attachment members 580.

As shown, the adapter 510 may define first and second openings 512, 513 that extend therethrough. The adapter 510 may define a rear surface 514 that is configured to abut a surface of a structure to which the first and second mechanical switches 370, 570 are installed, such as a wallboard surface that surrounds a double-gang wallbox in which the first and second mechanical switches 370, 570 are installed. The adapter 510 may be configured to enable removable attachment of the faceplate 560 to the adapter 510. For example, the adapter 510 may define one or more attachment members that are configured to engage with complementary features of the faceplate 560. As shown, the adapter 510 may define one or more resilient snap fit connectors 518 that are configured to engage with complementary features of the faceplate 560. The adapter 510 may be made of any suitable material, such as plastic.

Figure 23A:
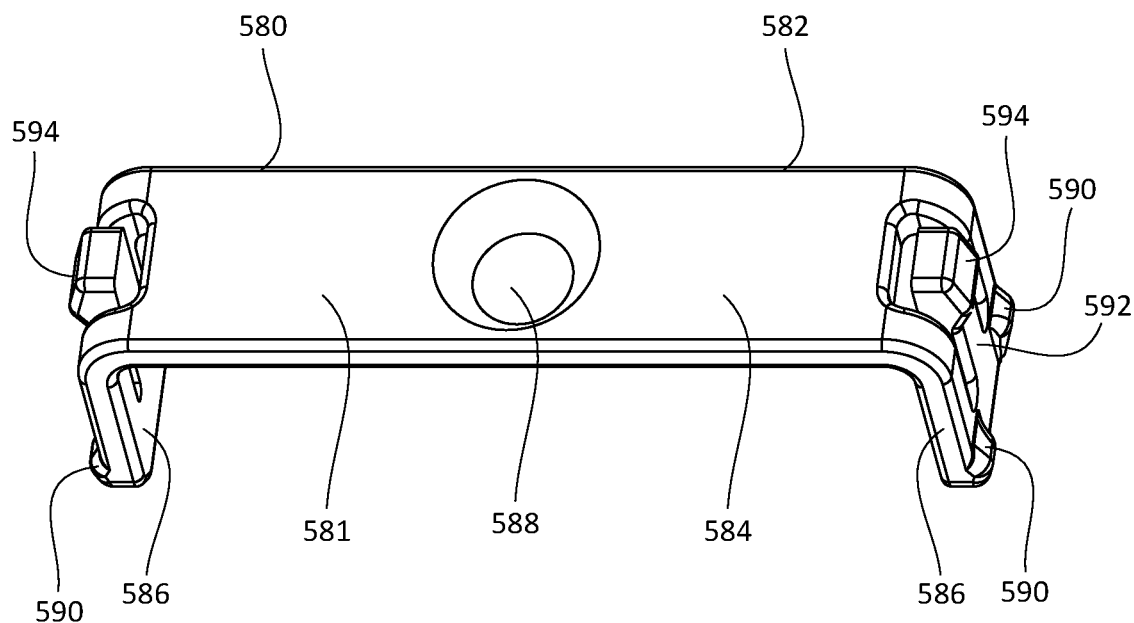
FIG. 23A is a front perspective view of an attachment member component of the example remote control device illustrated in FIG. 22.
Figure 23B:
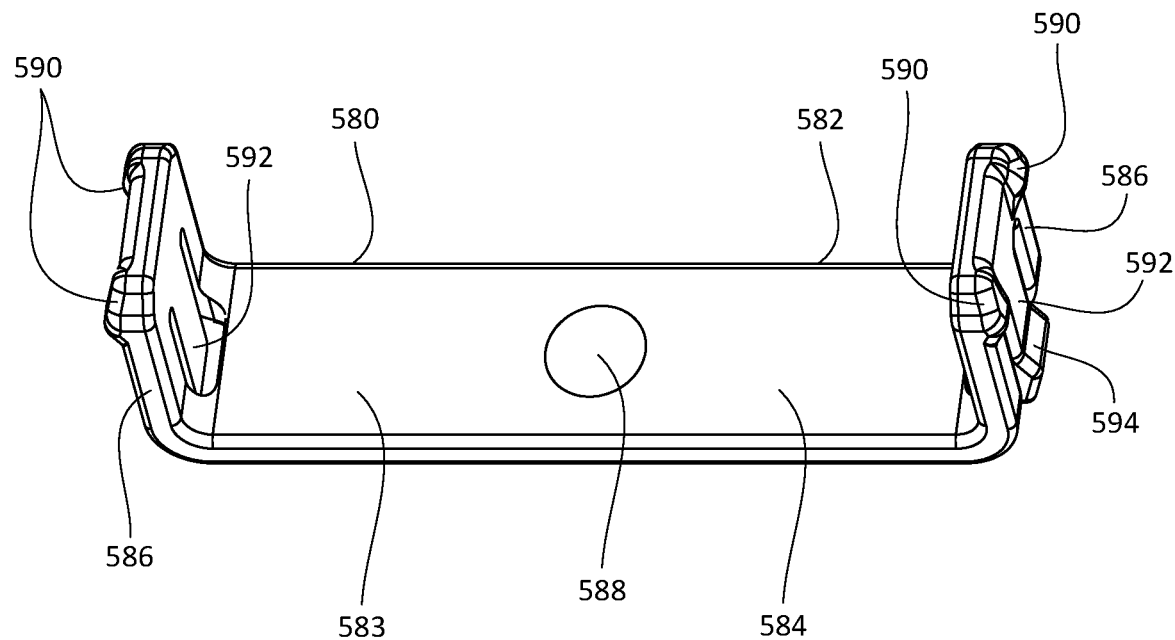
FIG. 23B is a rear perspective view of an attachment member component of the example remote control device illustrated in FIG. 22.

Referring now to FIGS. 23A and 23B, the attachment members 580 may be configured as attachment brackets 582. As shown, each attachment bracket 582 may have a "U" shaped body that defines a plate 584 that is elongate between opposed ends, and a pair of legs 586 that extend perpendicular to the plate 584 from the ends thereof. The plate 584 of each attachment bracket 582 may define a first abutment surface 581 and an opposed second abutment surface 583. The first and second abutment surfaces 581, 583 may be referred to as yoke abutment surfaces. The plate 584 of each may define an aperture 588 that extends therethrough, and that is configured to receive a fastener, such as a screw 589.

As shown, the legs 586 of each attachment bracket 582 may define one or more snap fit connectors 590 at free ends of the legs 586. Additionally, each leg 586 of each attachment bracket 582 may define a resilient, deflectable cantilevered beam 592 that extends from the free end of the 586 toward the plate 584. Each beam 592 may define a snap fit connector 594 at a free end thereof. The snap fit connectors 590 and 594 may enable releasable attachment of the attachment brackets 582 to the adapter 510.

Figure 24:
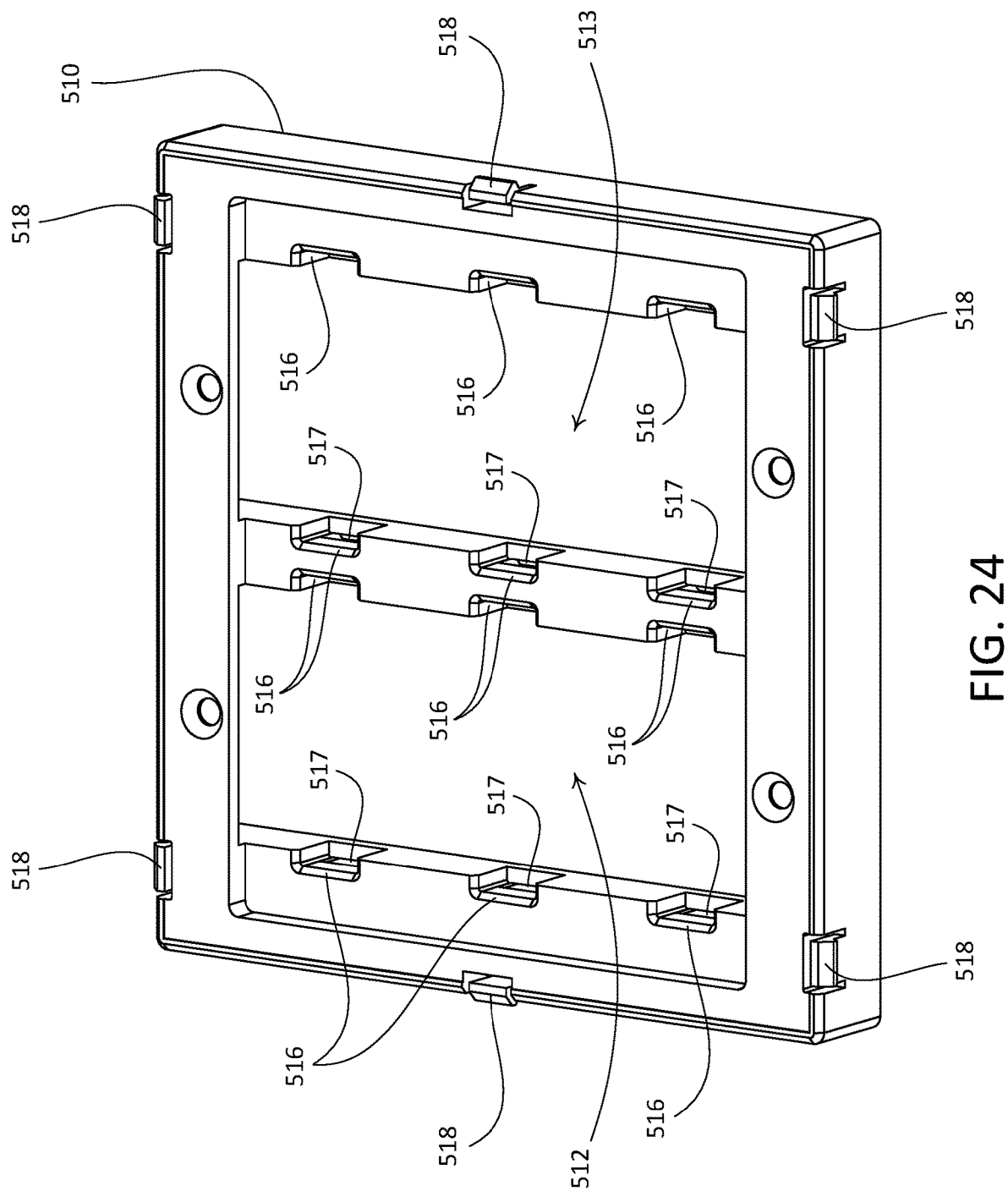
FIG. 24 is a front perspective view of an adapter component of the example remote control device illustrated in FIG. 22.

Referring now to FIG. 24, the adapter 510 may be configured to enable installation of one or more attachment brackets 582 into the adapter 510. For example, as shown, the first opening 512 of the adapter 510 defines three pairs of recesses 516 that extend into opposed sides of the first opening 512, and the second opening 513 of the adapter 510 similarly defines three pairs of recesses 516 that extend into opposed sides of the second opening 513. Each recess 516 may define an opening 517 that is configured to receive and engage with a complementary attachment feature of an attachment bracket 582, such as the snap fit connectors 590 of an attachment bracket 582 or the snap fit connectors 594 of an attachment bracket 582.

Figure 25:
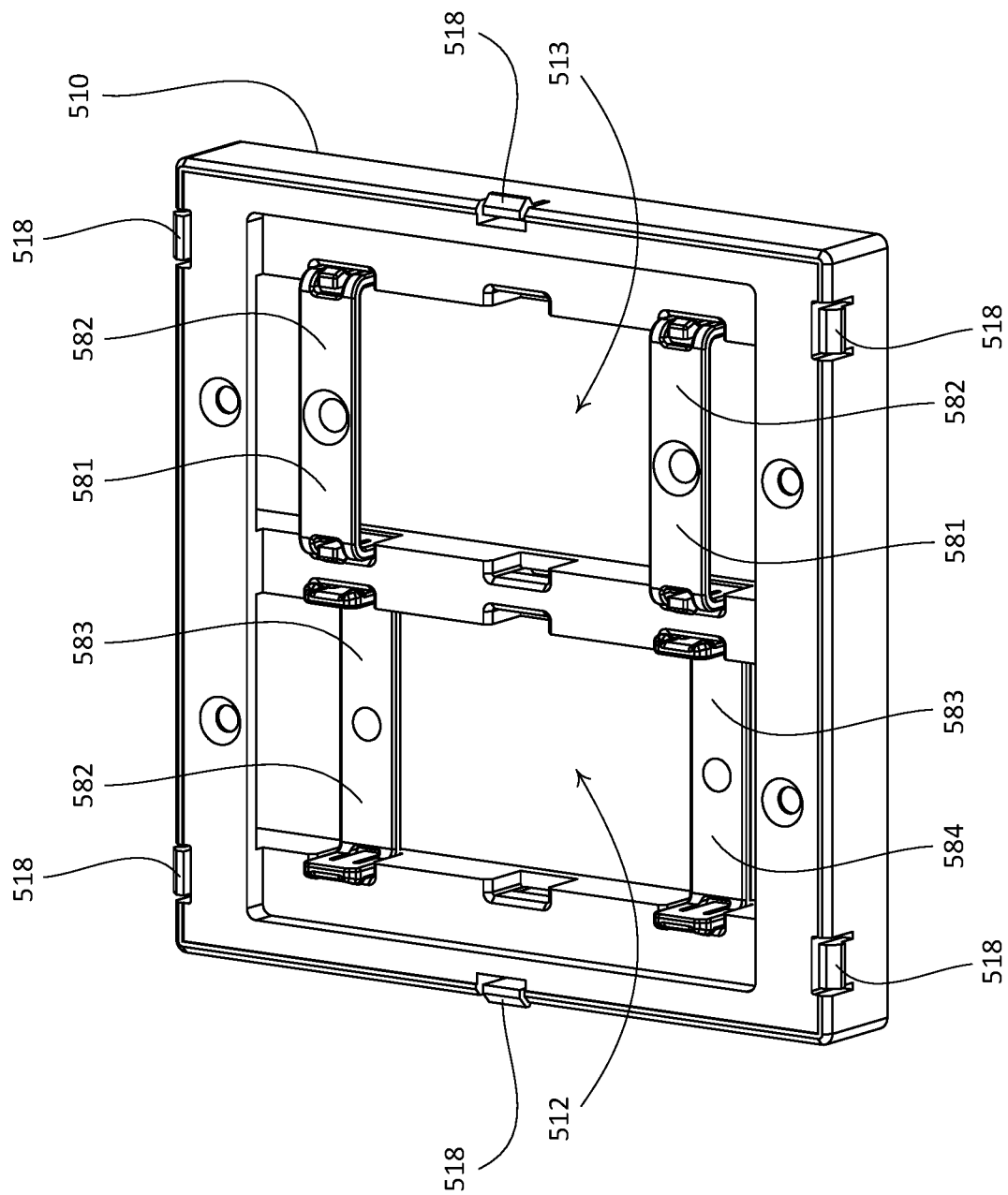
FIG. 25 is a front perspective view of the adapter component of the example remote control device illustrated in FIG. 24, with a plurality of the attachment member components illustrated in FIGS. 23A-23B installed therein.

The illustrated configuration of the attachment brackets 582 may enable the attachment brackets 582 to be installed into the adapter 510 in respective first and second orientations. For example, as shown in FIG. 25, a first pair of attachment brackets 582 are installed in the first opening 512 of the adapter 510 in accordance with the first installed orientation. When installed into an opening of the adapter 510 in the first orientation, the snap fit connectors 594 of an attachment bracket may be received in, and engage within, the openings 517 of corresponding recesses 516 of the opening. When installed in the first orientation, the plate 584 of an attachment bracket 582 may be disposed near the rear surface 514 of the adapter, with the first abutment surface 581 facing toward the first and second mechanical switches 370, 570 and the second abutment surface 583 facing outward.

Further as shown in FIG. 25, a second pair of attachment brackets 582 are installed in the second opening 513 of the adapter 510 in accordance with the second installed orientation. When installed into an opening of the adapter 510 in the second orientation, the snap fit connectors 590 of an attachment bracket may be received in, and engage within, the openings 517 of corresponding recesses 516 of the opening. When installed in the second orientation, the plate 584 of an attachment bracket 582 may be spaced from the rear surface 514 of the adapter, with the first abutment surface 581 facing outward and the second abutment surface 583 facing toward the first and second mechanical switches 370, 570.

The faceplate 560 may define a front surface 561 and an opposed rear surface 563. The front surface 561 may alternatively be referred to as an outer surface of the faceplate 560, and the rear surface 563 may alternatively be referred to as an inner surface of the faceplate 560. As shown in FIG. 22, the faceplate 560 may define respective a first opening 562 therethrough that is configured to receive a portion of the control unit 530, such that the control unit 530 protrudes proud of the faceplate 560 when the remote control device 500 is in an assembled configuration, and may define a second opening 564 therethrough that is configured to receive at least a portion of the second mechanical switch 570, such as the actuator 572 and the bezel 573. In an alternative configuration of the faceplate 560 (not shown), the second opening may be configured similarly to the first opening 562, and the faceplate 560 may further include a removable insert that snaps into the second opening 564, and that defines a smaller opening therethrough that is configured to receive the actuator 572 and the bezel 573 of the second mechanical switch 570.

The faceplate 560 may define recessed ledges (not shown), which may be configured similarly to the recessed 465 of the faceplate 460, and that are configured to engage with corresponding ones of the snap fit connectors 518 of the adapter 510, to releasably attach the faceplate 560 to the adapter 510. The faceplate 560 may be made of any suitable material, such as plastic. The faceplate 560 may include a shorting member (not shown), which may be configured similarly to the shorting members 466 of the faceplate 460, and that is located along a lower edge of the first opening 562. This may enable the control unit 530 to determine an orientation of the control unit 530 relative to the faceplate 560, and thereby an orientation of the control unit 530 relative to the adapter 510.

Prior to installation of the remote control device 500, a pre-existing faceplate (not shown) may be removed from the first and second mechanical switches 370, 570, for instance by removing faceplate screws (not shown) from corresponding faceplate screw holes 376, 576 in the yokes 374, 574 of the first and second mechanical switches 370, 570, respectively. The adapter 510 may be configured to be attached to the yoke 374 of the first mechanical switch 370 and to the yoke 574 of the second mechanical switch 570, for instance via the attachment brackets 582. For example, the adapter 510 may be secured to the yokes 374, 574 by driving the screws 589 of the attachment brackets 582 into the faceplate screw holes 376, 576 of the yokes 374, 574.

Figure 26A:
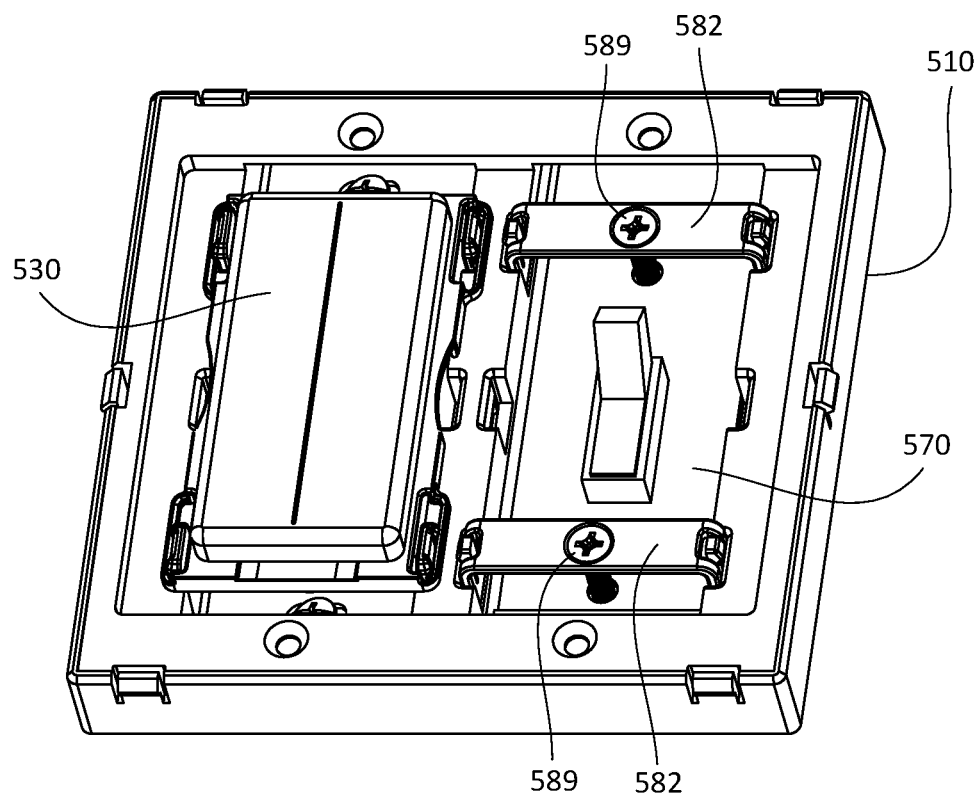
FIGS. 26A and 26B are front perspective views of the adapter component illustrated in FIG. 25, with a control unit component of the example remote control device illustrated in FIG. 22 attached thereto.
Figure 26B:
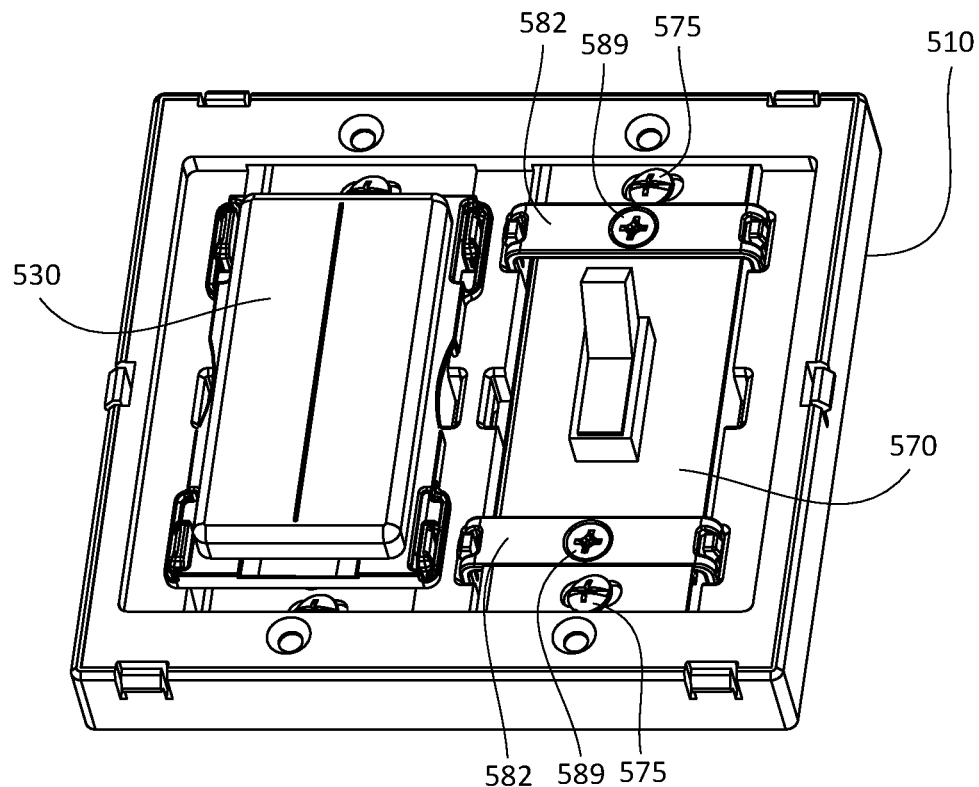
Figure 28:
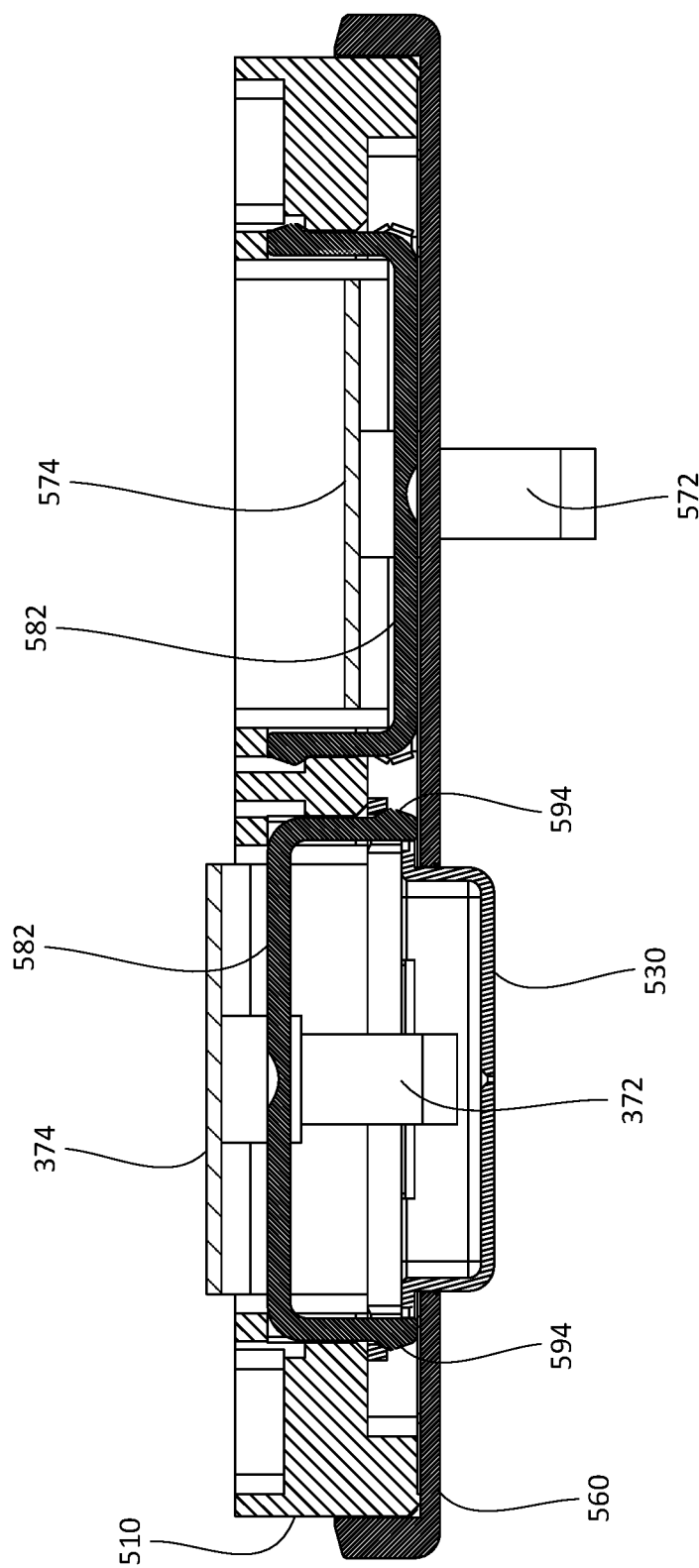
FIG. 28 is a top section view of the example remote control device illustrated in FIG. 21.

FIGS. 26A and 26B illustrate the adapter 510 with the control unit 530 attached thereto over the first opening 512, and thus over the first mechanical switch 370. The control unit 530 may be attached to the adapter 510 by snapping the control unit 530 onto the snap fit connectors 590 of the attachment brackets 582 installed in the first opening 512. Before installation of the remote control device 500, an original installed position of the second mechanical switch 570 (e.g., with the yoke 574 screwed to the double-gang wallbox) may cause the actuator 572 and the bezel 573 of the second mechanical switch 570 to be recessed relative to the front surface 561 of the faceplate 560. However, during attachment of the adapter 510 to the yoke 574 of the second mechanical switch 570, screws 575 that secure the yoke 574 to the double-gang wallbox may be loosened. With the screws 575 loosened, the screws 589 of the attachment brackets 582 that are installed in the second opening 513 of the adapter 510 may be tightened, which may draw the yoke 574 of the second mechanical switch 570 outward relative to the double-gang wallbox and toward a front surface of the adapter 510. The process of loosening the screws 575, followed by tightening the screws 589, may be repeated until the yoke 574 of the second mechanical switch 570 is moved outward sufficiently such that the bezel 573 is substantially flush with, or protrudes proud of, the front surface 561 of the faceplate 560 when the faceplate 560 is attached to the adapter, for instance as shown in FIGS. 27B and 27C. In this regard, the adapter 510 may be configured to enable adjustment of the yokes 374, 574 of the first and second mechanical switches 370, 570, respectively, toward and away from the double-gang wallbox, and toward or away from the front surface 561 of the faceplate 560.

It should be appreciated that the example remote control devices 100, 200, 300, 400, and 500 illustrated and described herein may provide a simple retrofit solution for an existing switched control system, and may ease the installation of a load control system or enhance an existing load control system installation. A load control system that integrates one or more remote control devices 100, 200, 300, 400, or 500 may provide energy savings and/or advanced control features, for example without requiring any electrical re-wiring and/or without requiring the replacement of any existing mechanical switches.

It should further be appreciated that load control systems into which the example remote control devices 100, 200, 300, 400, and 500 may be integrated are not limited to the example load control devices and/or electrical loads described above. For example, load control systems into which the remote control devices 100, 200, 300, 400, and 500 may be integrated may include one or more of: a dimming ballast for driving a gas-discharge lamp; a light-emitting diode (LED) driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; hydraulic valves for use in one or more radiators of a radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and the like.

What is claimed is:

1. A remote control device that is configured for use in a load control system having first and second electrical devices installed in a multi-gang wallbox, the remote control device comprising:
an adapter defining a first opening and a second opening;
an attachment member that is configured to be installed into the adapter in the first opening in first or second orientations to attach to a first yoke of the first electrical device and configured to be installed into the adapter in the second opening in the first or second orientations to attach to a second yoke of the second electrical device, the attachment member comprising a plate that is elongate between a pair of legs that extend perpendicular from opposed ends of the plate, wherein the plate is spaced a first distance from a rear surface of the adapter when the attachment member is installed in the adapter in the first orientation, and wherein the plate is spaced a second distance from the rear surface of the adapter when the attachment member is installed in the adapter in the second orientation, wherein the first distance is different than the second distance; and
a control unit that is configured to be mounted over the first electrical device or the second electrical device, the control unit including a user interface and a wireless communication circuit, the control unit configured to translate a user input from the user interface into a control signal that controls a load control device of the load control system, and to cause the wireless communication circuit to transmit the control signal.

2. The remote control device of claim 1, wherein the control unit is configured to attach to the attachment member.

3. The remote control device of claim 1, wherein when the first electrical device is mounted in the multi-gang wallbox adjacent to the second electrical device, the first opening is configured to surround a bezel of the first electrical device and the second opening is configured to surround a portion of the second electrical device.

4. The remote control device of claim 3, wherein the control unit is configured to be mounted over the second electrical device.

5. The remote control device of claim 4, wherein the attachment member is installed in the second opening in the second orientation, wherein the plate is located behind the rear surface of the adapter when the attachment member is in the second orientation such that the second electric device is recessed relative to the first electrical device.

6. The remote control device of claim 1, wherein the plate defines a first yoke abutment surface on a first side of the plate and a second yoke abutment surface on a second side of the plate.

7. The remote control device of claim 1, wherein each of the pair of legs defines one or more snap fit connectors that enable releasable attachment of the attachment member to the adapter.

8. The remote control device of claim 7, wherein each of the first opening and the second opening of the adapter define pairs of recesses that are configured to receive the snap fit connectors such that the attachment member can be installed in first and second orientations.

9. The remote control device of claim 8, wherein each recess of the pairs of recesses in the first opening extend into opposed sides of the first opening, and wherein each recess of the pairs of recesses in the second opening extend into opposed sides of the second opening.

10. The remote control device of claim 8, wherein each recess of the pairs of recesses comprises a third opening that is configured to engage a respective one of the one or more snap fit connectors.

11. The remote control device of claim 1, wherein the attachment member is a first attachment member installed in the first opening, the plate is a first plate, and the pair of legs is a first pair of legs, the remote control device further comprising a second attachment member that is configured to be installed into the adapter in the second opening in the first orientation or the second orientation to attach to the second yoke of the second electrical device, the second attachment member comprising a second plate that is elongate between a second pair of legs that extend perpendicular from opposed ends of the second plate.

12. The remote control device of claim 11, wherein the first attachment member is installed in the first opening in the first orientation and the second attachment member is installed in the second opening in the second orientation.

13. The remote control device of claim 11, wherein the first attachment member is a first pair of attachment members configured to be installed in the first opening in the first orientation and the second attachment member is a second pair of attachment members configured to be installed in the second opening in the second orientation.

14. The remote control device of claim 11, wherein the first attachment member and the second attachment member are configured to enable adjustment of the first and second yokes, respectively, toward and away from the multi-gang wallbox.

15. The remote control device of claim 1, further comprising a faceplate that is configured to be attached to the adapter, wherein the faceplate is spaced from a surface of a structure to which the first electrical device is mounted.

16. The remote control device of claim 1, wherein the first electrical device is a first mechanical switch.

17. The remote control device of claim 16, wherein the second electrical device is a second mechanical switch mounted next to the first mechanical switch.

18. A mounting assembly configured to be mounted over first and second electrical devices installed in a multi-gang wallbox, the mounting assembly comprising:
an adapter defining a first opening and a second opening; and
an attachment member that is configured to be installed into the adapter in the first opening in first or second orientations to attach to the first yoke of the first electrical device and configured to be installed into the adapter in the second opening in the first or second orientations to attach to a second yoke of the second electrical device, the attachment member comprising a plate that is elongate between a pair of legs that extend perpendicular from opposed ends of the plate, wherein the plate is spaced a first distance from a rear surface of the adapter when the attachment member is installed in the adapter in the first orientation, and wherein the plate is spaced a second distance from the rear surface of the adapter when the attachment member is installed in the adapter in the second orientation, and wherein the first distance is different than the second distance, and wherein the attachment member is configured to enable attachment of a control unit to the mounting assembly.

19. The mounting assembly of claim 18, wherein when the first electrical device is mounted in the multi-gang wallbox adjacent to the second electrical device, the first opening is configured to surround a bezel of the first electrical device and the second opening is configured to surround a portion of the second electrical device.

20. The mounting assembly of claim 19, wherein a control unit is configured to be mounted over the second electrical device.

21. The mounting assembly of claim 20, wherein the attachment member is installed in the second opening in the second orientation, wherein the plate is located behind the rear surface of the adapter when the attachment member is in the second orientation such that the second electric device is recessed relative to the first electrical device.

22. The mounting assembly of claim 18, wherein the plate defines a first yoke abutment surface on a first side of the plate and a second yoke abutment surface on a second side of the plate.

23. The mounting assembly of claim 18, wherein each of the pair of legs defines one or more snap fit connectors that enable releasable attachment of the attachment member to the adapter.

24. The mounting assembly of claim 23, wherein each of the first opening and the second opening of the adapter define pairs of recesses that are configured to receive the snap fit connectors such that the attachment member can be installed in first and second orientations.

25. The mounting assembly of claim 24, wherein each recess of the pairs of recesses in the first opening extend into opposed sides of the first opening, and wherein each recess of the pairs of recesses in the second opening extend into opposed sides of the second opening.

26. The mounting assembly of claim 24, wherein each recess of the pairs of recesses comprises a third opening that is configured to engage a respective one of the one or more snap fit connectors.

27. The mounting assembly of claim 18, wherein the attachment member is a first attachment member installed in the first opening, the plate is a first plate, and the pair of legs is a first pair of legs, the remote control device further comprising a second attachment member that is configured to be installed into the adapter in the second opening in the first orientation or the second orientation to attach to the second yoke of the second electrical device, the second attachment member comprising a second plate that is elongate between a second pair of legs that extend perpendicular from opposed ends of the second plate.

28. The mounting assembly of claim 27, wherein the first attachment member is installed in the first opening in the first orientation and the second attachment member is installed in the second opening in the second orientation.

29. The mounting assembly of claim 27, wherein the first attachment member is a first pair of attachment members configured to be installed in the first opening in the first orientation and the second attachment member is a second pair of attachment members configured to be installed in the second opening in the second orientation.

30. The mounting assembly of claim 27, wherein the first attachment member and the second attachment member are configured to enable adjustment of the first and second yokes, respectively, toward and away from the multi-gang wallbox.

31. The mounting assembly of claim 18, wherein the adapter is configured to enable attachment of a faceplate to the adapter.

32. The mounting assembly of claim 18, wherein the first electrical device is a first mechanical switch.

33. The remote control device of claim 32, wherein the second electrical device is a second mechanical switch mounted next to the first mechanical switch.

* * * * *